United States Patent
Aruga et al.

(10) Patent No.: US 10,164,651 B2
(45) Date of Patent: Dec. 25, 2018

(54) A/D CONVERTER, A/D CONVERSION METHOD, AND SEMICONDUCTOR INTEGRATED CIRCUIT

(71) Applicant: SOCIONEXT INC., Yokohama-shi, Kanagawa (JP)

(72) Inventors: Kenta Aruga, Yokohama (JP); Yasuhiro Mizuno, Yokohama (JP); Masato Yoshioka, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/921,337

(22) Filed: Mar. 14, 2018

(65) Prior Publication Data

US 2018/0205388 A1   Jul. 19, 2018

Related U.S. Application Data

(63) Continuation of application No. PCT/JP2016/057849, filed on Mar. 11, 2016.

(30) Foreign Application Priority Data

Oct. 22, 2015 (JP) ................................ 2015-207970

(51) Int. Cl.
*H03M 1/06* (2006.01)
*H03M 1/38* (2006.01)
(Continued)

(52) U.S. Cl.
CPC ........... *H03M 1/0678* (2013.01); *H03M 1/38* (2013.01); *H03M 1/46* (2013.01); *H04N 5/50* (2013.01)

(58) Field of Classification Search
CPC ........ H03M 1/0678; H03M 1/12; H03M 1/00; H03M 5/50; H03M 1/06; H03M 1/802; H03M 1/804; H03M 1/806; H04N 5/50
(Continued)

(56) References Cited

U.S. PATENT DOCUMENTS 4,973,864 A   11/1990 Nogami
5,870,052 A   2/1999 Dedic et al.
(Continued)

FOREIGN PATENT DOCUMENTS

JP   1990(H02)-024898 A   1/1990
JP   2003-283336 A   10/2003
(Continued)

OTHER PUBLICATIONS

F. Kuttner, "A 1.2V 10b 20MSample/s Non-Binary Successive Approximation ADC in 0.13μm CMOS," ISSCC Digest of Technical Papers, 10.6, Feb. 2002.
(Continued)

*Primary Examiner* — Jean B Jeanglaude
(74) *Attorney, Agent, or Firm* — Arent Fox LLP

(57) ABSTRACT

An A/D converter includes a capacitor DAC, a resistor DAC, a first capacitive element, and a comparator. The capacitor DAC is configured to convert high-order M bits, where M and N are integers equal to or greater than 2, and the resistor DAC is configured to convert low-order N bits. The first capacitive element is provided between the capacitor DAC and the resistor DAC, and the comparator is configured to compare an input signal voltage with a voltage output from the capacitor DAC. The resistor DAC generates and outputs a voltage by adding or subtracting a wait based on redundant bits in addition to N-bit resolution.

14 Claims, 16 Drawing Sheets

(51) Int. Cl.
*H03M 1/46* (2006.01)
*H04N 5/50* (2006.01)

(58) Field of Classification Search
USPC .............. 341/118, 119, 120, 155, 154, 161
See application file for complete search history.

(56) References Cited

U.S. PATENT DOCUMENTS

| | | | |
|---|---|---|---|
| 2003/0179124 A1 | 9/2003 | Harada | |
| 2003/0234736 A1* | 12/2003 | Tachibana | H03M 1/68 341/172 |
| 2008/0198056 A1 | 8/2008 | Hurrell | |
| 2009/0102694 A1* | 4/2009 | Nittala | H03M 1/462 341/165 |
| 2010/0001892 A1 | 1/2010 | Aruga et al. | |
| 2010/0188277 A1* | 7/2010 | Aruga | H03M 1/1215 341/158 |
| 2011/0234433 A1* | 9/2011 | Aruga | H01L 23/5223 341/172 |
| 2011/0249710 A1* | 10/2011 | Chou | H03M 3/398 375/219 |
| 2012/0026023 A1 | 2/2012 | Inoue | |
| 2012/0161997 A1* | 6/2012 | Chou | H03M 1/0624 341/150 |
| 2014/0062750 A1 | 3/2014 | Morie et al. | |

FOREIGN PATENT DOCUMENTS

| | | |
|---|---|---|
| JP | 2004-032089 A | 1/2004 |
| JP | 2004-080075 A | 3/2004 |
| JP | 2006-157484 A | 6/2006 |
| JP | 2009-232281 A | 10/2009 |
| JP | 2010-519810 A | 6/2010 |
| JP | 2010-245927 A | 10/2010 |
| JP | 2011-205230 A | 10/2011 |
| JP | 2014-042358 A | 3/2014 |
| WO | WO 2012-157155 A | 11/2012 |

OTHER PUBLICATIONS

Chun-Cheng Liu et al., "A 10b 100MS/s 1.13mW SAR ADC with Binary-Scaled Error Compensation," ISSCC Digest of Technical Papers, 21.5, pp. 386-387, Feb. 2010.
Chun-Cheng Liu et al., "A 0.92mW 10-bit 50-MS/s SAR ADC in 0.13μm CMOS Process," Symposium on VLSI Circuits Digest of Technical Papers, 23-1, pp. 236-237, Jun. 2009.
Written Opinion and International Search Report of related foreign application PCT/JP2016/057849 dated May 10, 2016.

* cited by examiner

[WHEN B1R = 0]

[WHEN B1R = 1]

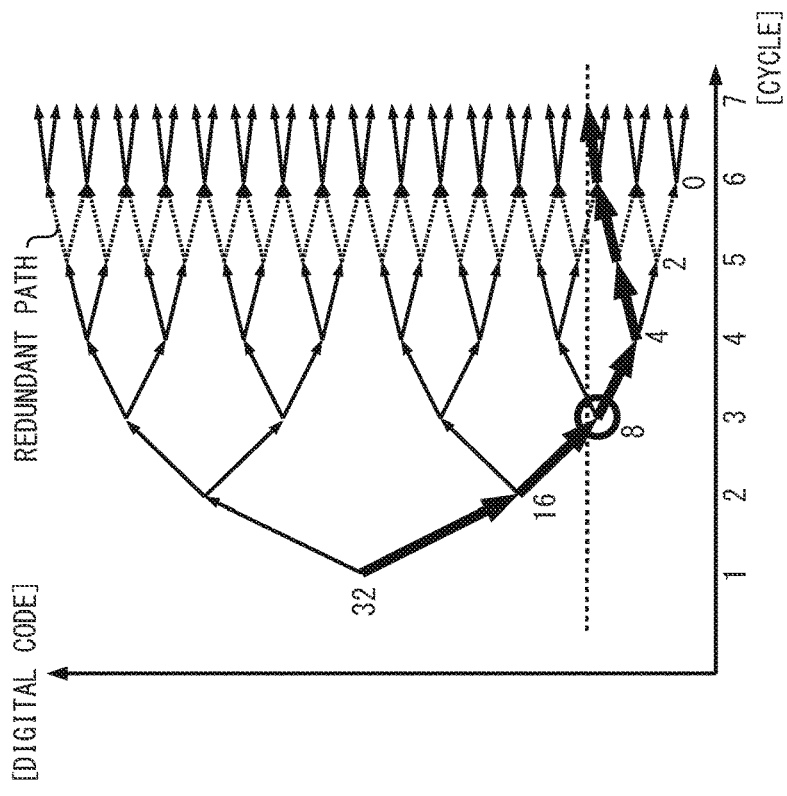
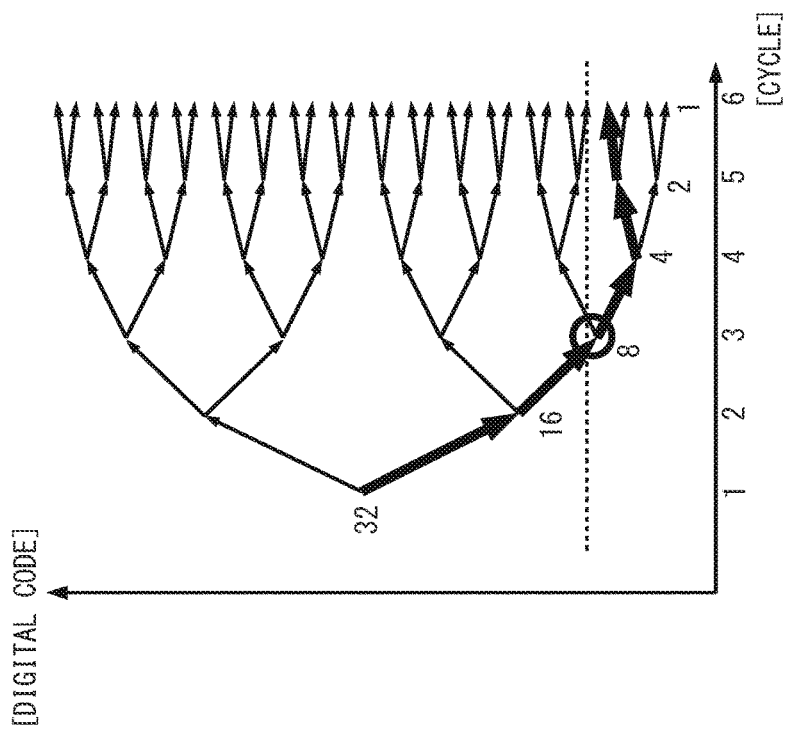
FIG. 8A
FIG. 8B

A/D CONVERTER, A/D CONVERSION METHOD, AND SEMICONDUCTOR INTEGRATED CIRCUIT

CROSS-REFERENCE TO RELATED APPLICATIONS

This application is a continuation application and is based upon PCT/JP2016/057849, filed on Mar. 11, 2016, which claims the benefit of priority of the prior Japanese Patent Application No. 2015-207970, filed on Oct. 22, 2015, the entire contents of which are incorporated herein by reference.

FIELD

Embodiments discussed herein relate to an A/D converter, an A/D conversion method, and a semiconductor integrated circuit.

BACKGROUND

An A/D converter (analog/digital converter: Analog to Digital converter: hereinafter, also referred to as an ADC) samples a voltage of an input analog signal, and converts to a digital code corresponding to a magnitude of the input analog voltage (voltage of the input signal).

A successive approximation A/D converter (successive approximation type analog/digital converter: Successive Approximation ADC: hereinafter, also referred to as an SAR-ADC), which is a form of the ADC, includes high compatibility with CMOS processes and may be manufactured at relatively low cost.

Further, the SAR-ADC may achieve a relatively fast conversion time, for example, in a recent miniaturized manufacturing process and 8-bit to 12-bit resolution, may achieve in a speed of about several tens to several hundred mega samples/sec.

Incidentally, the SAR-ADC is, for example, built-in a Micro-Controller Unit (MCU) or widely applied to various semiconductor integrated circuits including a digital TV demodulation IC (Integrated Circuit).

Here, the SAR-ADC includes, for example, an internal D/A converter (digital/analog converter: Digital to Analog Converter: hereinafter, also referred to as a DAC), a comparator, and a control circuit for controlling them.

Such an SAR-ADC compares an input signal voltage with a voltage generated by the internal D/A converter in many times, and determines (obtains) a digital code corresponding to the input signal voltage, wherein the determining of the comparator may be generally performed by using a binary search.

As described above, the SAR-ADC generally converts an input signal voltage into a digital code by comparing and determining a relationship between a voltage generated by the internal D/A converter and the input signal voltage in many times based on the binary search.

Conventionally, regarding an A/D converter, in a region where a high-speed A/D conversion is required, a pipeline ADC is generally applied. However, in accordance with miniaturization of manufacturing process, a power supply voltage is reduced to 1 Volt or lower, and now, a high gain amplifier, which is used as a major component of the pipeline ADC, may become difficult to realize.

At present, an SAR-ADC has been widely applied in accordance with the above circumstances. Specifically, in the SAR-ADC, the high gain amplifier is not necessary, and further, power efficiency may be improved in accordance with the miniaturization of the manufacturing process.

As described above, in accordance with the miniaturization of the manufacturing process, an SAR-ADC may become possible to operate at a high speed. Nevertheless, a problem where an operation speed of the ADC is limited by a bandwidth of a package may be caused.

For example, the performance of the device (SAR-ADC) is improved in accordance with the miniaturization of the manufacturing process, but a size of a semiconductor integrated circuit (IC package) applying the device is not sufficiently reduced.

Specifically, in a 12-bit SAR-ADC, for example, at least 12 times of determination processes may be necessary to obtain a 12-bit result (digital codes) by using a binary search. Further, in the case of requesting some cycles in addition to cycles for directly determining the digital code, for example, 20 clock cycles may be necessary to obtain the 12-bit result.

Therefore, for example, in order to achieve 50 MSPS by using an SAR-ADC which requires 20 clock cycles for one conversion time, the clock frequency may be set to 1 GHz, i.e., a clock cycle time may be set to 1 ns. This means that the reference voltage supplied via the IC packages may be converged within 1 ns.

However, in the case of a typical low-cost IC package, a parasitic inductance of approximately 6 nH per pin may be present. Therefore, it is difficult to converge the reference voltage within 1 ns.

Here, the above matter may cause a decision error of comparing the input signal voltage with the voltage generated by the internal DAC (output of the internal DAC). Further, for example, when a decision error is caused in a prescribed bit by the comparator, it is difficult to correct (compensate) subsequent low-order bits of the prescribed bit.

As described above, in the conventional SAR-ADC (A/D converter), various problems to be solved may be present, and therefore, for example, it is required to realize a low voltage and a high-speed operation, and compensate a decision error caused by comparing an input signal voltage with an output of the internal DAC.

A various successive approximation A/D converter applied to a semiconductor integrated circuit has conventionally been proposed.

Patent Document 1: Japanese Laid-Open Patent Publication No. 2014-042358
Patent Document 2: Japanese National Publication of International Patent Application No. 2010-519810
Patent Document 3: Japanese Laid-Open Patent Publication No. 2003-283336
Patent Document 4: Japanese Laid-Open Patent Publication No. 2004-032089
Patent Document 5: Japanese Laid-Open Patent Publication No. 2004-080075
Patent Document 6: U.S. Pat. No. 5,870,052
Patent Document 7: International Publication Pamphlet No. WO 2012/157155
Patent Document 8: Japanese Laid-Open Patent Publication No. 2011-205230
Patent Document 9: Japanese Laid-Open Patent Publication No. H02(1990)-024898
Non-Patent Document 1: F. KUTTNER, "A 1.2V 10b 20M Sample/s Non-Binary Successive Approximation ADC in 0.13 μm CMOS", ISSCC Digest of Technical Papers, 10.6, February 2002.

Non-Patent Document 2: Chun-Cheng Liu et al., "A 10b 100 MS/s 1.13 mW SAR ADC with Binary-Scaled Error Compensation", ISSCC Digest of Technical Papers, 21.5, pp. 386-387, February 2010.

Non-Patent Document 3: Chun-Cheng Liu et al., "A 0.92 mW 10-bit 50-MS/s SAR ADC in 0.13 μm CMOS Process", Symposium on VLSI Circuits Digest of Technical Papers, 23-1, pp. 236-237, June 2009.

SUMMARY

According to an aspect of the embodiments, there is provided an A/D converter including a capacitor DAC, a resistor DAC, a first capacitive element, and a comparator. The capacitor DAC is configured to convert high-order M bits, where M and N are integers equal to or greater than 2, and the resistor DAC is configured to convert low-order N bits.

The first capacitive element is provided between the capacitor DAC and the resistor DAC, and the comparator is configured to compare an input signal voltage with a voltage output from the capacitor DAC. The resistor DAC generates and outputs a voltage by adding or subtracting a wait based on redundant bits in addition to N-bit resolution.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8A and FIG. 8B are diagrams for explaining the operation of the SAR-ADC depicted in FIG. 6 in comparison with an operation of the SAR-ADC depicted in FIG. 1;

DESCRIPTION OF EMBODIMENTS

First, before describing embodiments of an A/D converter, an A/D conversion method and a semiconductor integrated circuit, an example of an A/D converter and problems thereof will be explained with reference to FIG. 1 to FIG. 5.

Figure 1:
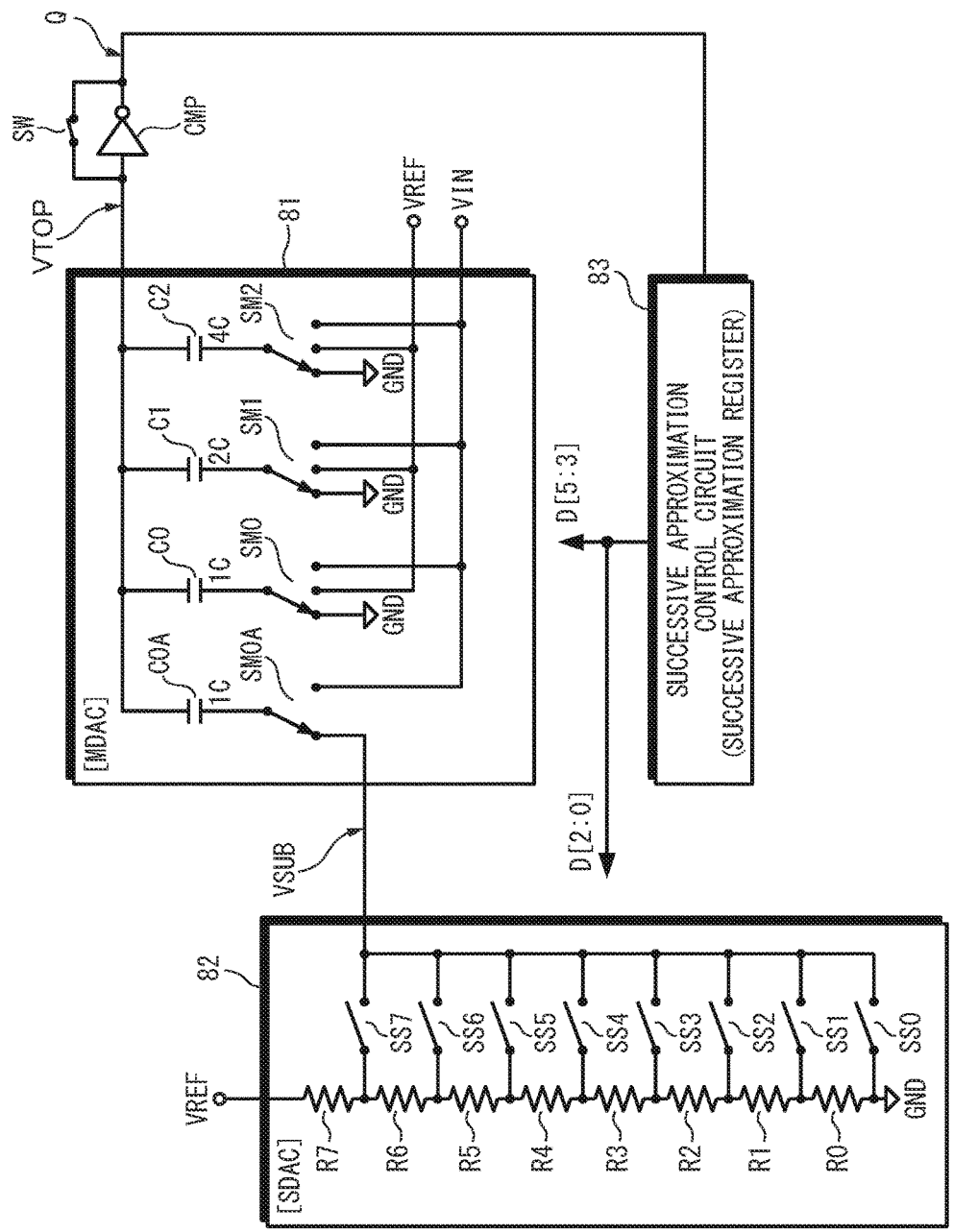
FIG. 1 is a circuit diagram depicting an example of an A/D converter (SAR-ADC)

FIG. 1 is a circuit diagram depicting an example of an A/D converter, and more specifically depicting an example of a successive approximation type A/D converter (SAR-ADC). Note that FIG. 1 depicts an SAR-ADC of 6-bit resolution in order to simplify the explanation thereof.

In FIG. 1, a reference sign 81 denotes a capacitor main DAC (capacitor DAC: MDAC), 82 denotes a resistor sub DAC (resistor DAC: SDAC), 83 denotes a successive approximation control circuit (Successive Approximation Register), and CMP denotes a comparator.

Further, reference signs C0A, C0, C1, C2 denote capacitive elements, 1C, 1C, 2C, 4C denote relative magnitudes of capacitance values of respective capacitive elements, SM0A, SM0, SM1, SM2, SS0 to SS7, SW denote switches, and R0 to R7 denote resistive elements.

Further, a reference sign Q denotes an output node of the CMP and a signal value thereof, D[5: 3] denote high-order 3 bits of a 6-bit digital code, D[2: 0] denote low-order 3 bits of the 6-bit digital code, and VIN denotes an analog input node and its voltage.

Further, a reference sign VREF denotes a reference voltage node and its voltage, VTOP denotes an output node of the capacitor main DAC 81 and its voltage, and VSUB denotes an output node of the resistor sub DAC 82 and its voltage.

As depicted in FIG. 1, an SAR-ADC includes an internal DAC (internal D/A converter) including a capacitor main DAC 81 and a resistor sub DAC 82, a comparator CMP, and a successive approximation control circuit (control circuit) 83 for controlling the internal DAC and the comparator CMP. Here, each of the capacitor main DAC 81 and resistor sub DAC 82 includes 3-bit resolution, and thus a whole 6-bit DAC (internal DAC) is constituted.

In the capacitor main DAC 81, high-order 3 bits D[5: 3] of the digital code is adapted to control connections of the switches SM2, SM1, SM0. Specifically, the most significant bit D[5] of D[5: 3] controls the switch SM2, a second bit D[4] from the most significant bit controls the switch SM1, and the least significant bit D[3] of D[5: 3] controls the switch SM0.

Here, when a bit corresponding to DM is at "1", all the switches SM0 to SM2 are connected to the reference voltage node VREF, and the bit corresponding to DM is at "0", all the switches SM0 to SM2 are connected to the ground GND (0V). Note that the reference sign DM denotes an optional bit (each of the high-order 3 bits of the digital code) which is determined by the capacitor main DAC 81.

The resistor sub DAC 82 includes eight resistive elements R0 to R7 used for dividing the reference voltage VREF, and eight switches SS0 to SS7 connected to respective branches of the resistive elements R0 to R7. The switches SS0 to SS7 select a divided voltage based on values of the low-order 3 bits D[2: 0] of the digital code, and generate an output voltage VSUB. Here, the output voltage VSUB of the resistor sub DAC 82 is expressed as follows:

$$VSUB=D[2:0]/8 \times VREF$$

Note that, when performing one A/D conversion, first, an analog input voltage (input signal voltage) VIN is sampled. Therefore, all of the switches SM0A, SM0, SM1, SM2 of the capacitor main DAC 81 are connected to VIN, and the switch SW is connected (closed). Here, the fact that closing the switch SW corresponds to applying a threshold voltage VT of the CMP to a top plate VTOP of the capacitors C0A, C0, C1, C2.

Specifically, bottom plates of all of the capacitors C0A, C0, C1, C2 are applied with a potential of VIN, the top plate VTOP thereof is applied with the threshold voltage VT of the CMP, and thereafter, when the switch SW is opened, a sampling process is completed. At this time, a sampled charge Q is expressed as follows:

$$Q=(VT-VIN) \times 8C$$

Next, a determination process of the most significant bit, i.e., whether the sampled input signal voltage VIN is higher or lower than a half value of a full scale of an output voltage of the DAC is performed. Here, in order to determine the most significant bit, the 6-bit data code D is set to D=100000.

Further, the switch SM2 is connected to VREF, the switches SM1 and SM0 are connected to 0V (GNG), and the switch SM0A is connected to VSUB. At this time, the output voltage VSUB of the resistor sub DAC 82 is at 0V. Therefore, VTOP is expressed as follows:

$$VTOP=VT-VIN+\frac{1}{2}VREF$$

Here, the above equation indicates, when VIN>½×VREF is established, VTOP becomes lower than the threshold voltage VT of the CMP, and when VIN<½× VREF is established, VTOP becomes higher than the threshold voltage VT.

Therefore, the output Q of the comparator CMP is at "0" when the input voltage is higher than the threshold VT, and is at "1" when the input voltage is lower than the threshold VT. Specifically, the comparator CMP determines whether or not VIN is higher than a half of VREF, and thereby the most significant bit of the A/D conversion results is obtained (determined). Therefore, the value obtained by inverting the value of Q is determined as the most significant bit.

Next, a second bit from the most significant bit is determined. At this time, the most significant bit is already determined, and therefore, the second bit from the top of DM is set to "1". Specifically, the 6-bit data code D is set to D=010000 or D=1100000.

By the above operation, the voltage of the VTOP is expressed as follows:

$$VTOP=VT-VIN+\frac{1}{4} \times VREF, \text{ when } D=010000$$

$$VTOP=VT-VIN+\frac{3}{4} \times VREF, \text{ when } D=110000$$

Specifically, the second bit from the top of DM is determined based on whether the voltage of VTOP is higher or lower than the threshold voltage VT by the comparator CMP. Thereafter, by applying the similar operation to all bits of the 6-bit data code D, the value of D in the case where the value of VT-VTOP is smallest may be obtained as a digital code (6-bit digital code) corresponding to the input signal voltage. The above series of decision procedure for determining respective bits, which narrows down the search range by half, is generally called as a binary search.

Figure 2:
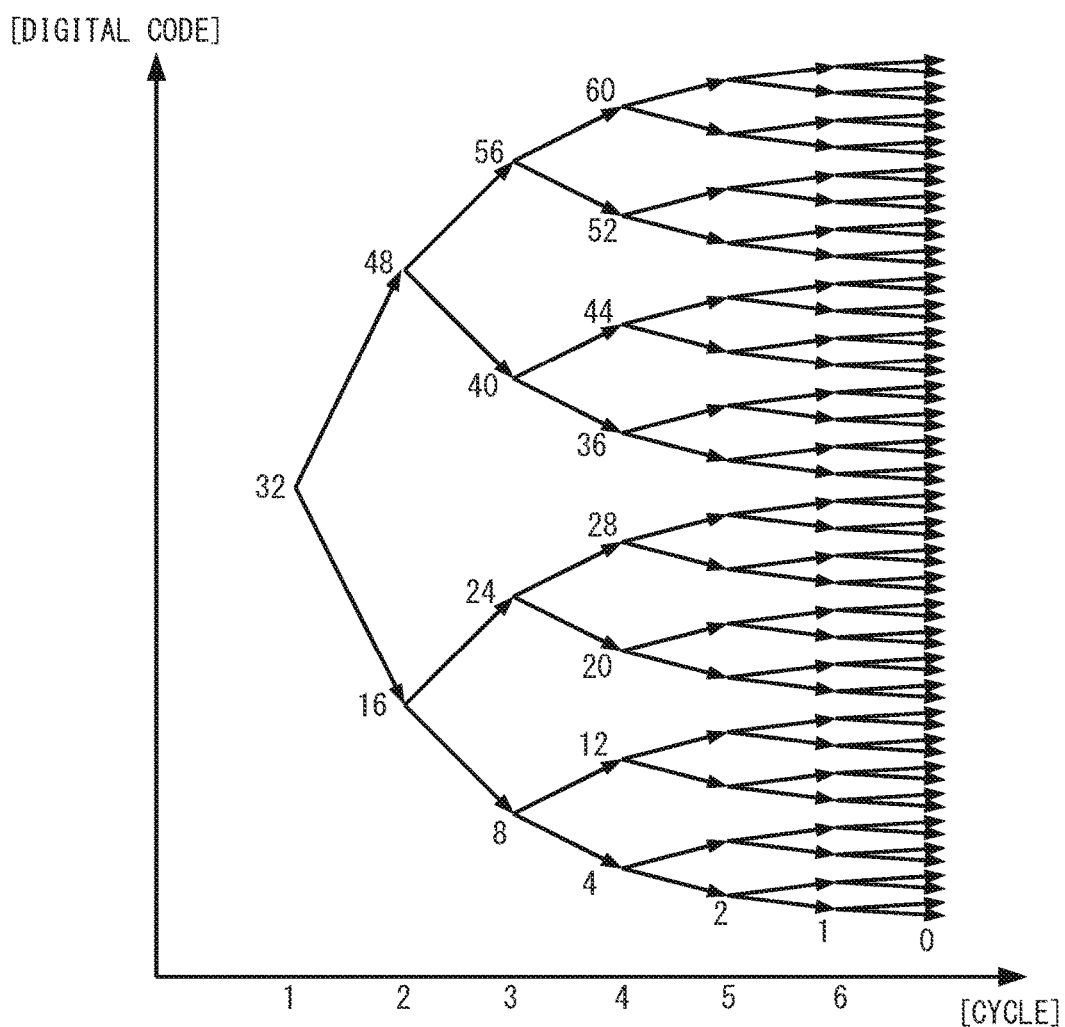
FIG. 2 is a diagram for explaining an example of a search procedure of the SAR-ADC.

FIG. 2 is a diagram for explaining an example of a search procedure of the SAR-ADC, and schematically indicates the binary search which is explained with reference to FIG. 1. In FIG. 2, a horizontal axis represents a search cycle, and a vertical axis represents a decimal value of a digital code D (input digital code for 6-bit internal DAC 81, 82).

As depicted in FIG. 2, a code "32" (½ of the full scale) is set in a first cycle, and whether the input signal voltage VIN is determined higher or lower than a voltage corresponding to the code "32" by the comparator CMP.

Next, in a second cycle, based on the determination result of the first cycle, whether the input signal voltage VIN is determined higher or lower than a voltage corresponding to a code "16" or "48" by the comparator CMP. Furthermore, in a third cycle, based on the determination result of the second cycle, the input signal voltage VIN is determined higher or lower than a voltage corresponding to one of voltages corresponding to codes "8", "24", "40", and "56".

Here, an output digital code of 6 bits (64 kinds) may be determined by passing one of paths in search procedures depicted in FIG. 2. Further, the output digital code of 6 bits is determined by using 6 cycles. Therefore, the SAR-ADC depicted in FIG. 1 may obtain an output digital code by converting an input signal voltage (analog input voltage) to a digital output code, by performing a binary search depicted in FIG. 2.

Incidentally, in order to improve an operation speed of the SAR-ADC using the binary search algorithm depicted in FIG. 2, for example, a time (cycle time) required for one determination may be shortened. However, when shortening the cycle time, an erroneous determination may be caused due to two reasons.

The first reason is considered that a settling time of the DAC (internal DAC 81, 82) may be insufficient. Specifically, the DAC operates to converge an analog output voltage to a target value by a certain time constant, and therefore, if the cycle time is shortened, the converge operation may not be performed in time.

The second reason is considered that the comparator CMP may cause a decision error. Specifically, in the case of shortening the cycle time, a determination of the comparator CMP may not be completed within the cycle time. Note that, for example, the comparator CMP may take a long time for the determination in accordance with an input potential difference (overdrive voltage) is small.

Figure 3:
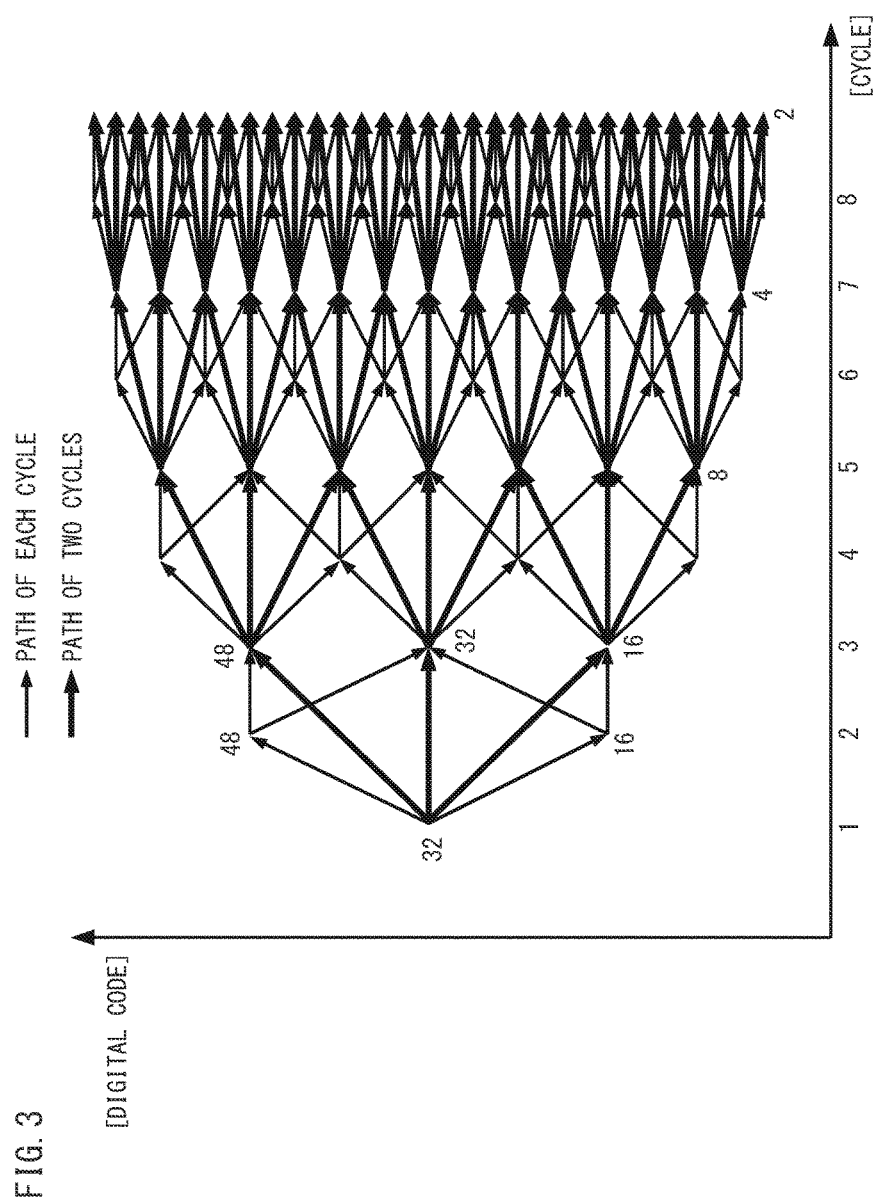
FIG. 3 is a diagram for explaining another example of the search procedure of the SAR-ADC.

Therefore, for example, a redundant search procedure may be considered as a method for reducing a decision error when a cycle time is shortened. FIG. 3 is a diagram for explaining another example of the search procedure of the SAR-ADC, and for explaining an example of the redundant search procedure (redundant search).

In FIG. 3, a horizontal axis represents a search cycle, and a vertical axis represents a decimal value of a digital code D. Further, in FIG. 3, a thin arrow line denotes a path of each cycle, and a thick arrow line denotes a path corresponding to two cycles.

Based on the search procedure depicted in FIG. 3, in a first cycle, a magnitude relationship between an input signal voltage VIN and a code "32" is determined, and in a second cycle, a magnitude relationship between the input signal voltage VIN and a code "16" or "48" is determined. Further, in accordance with the determination result, one of the codes "16", "32", "48" is reached (selected).

Here, in the binary search as depicted in FIG. 2, any one of four states is determined by two determination processes, however, in the redundant search depicted in FIG. 3, any one of three states is determined by two determination processes.

Therefore, in accordance with the procedure depicted in FIG. 3, in order to obtain a 6-bit result, determination processes of 12 times may be performed.

However, the search procedure depicted in FIG. 3, when one determination process is erroneously performed (one determination is incorrect), the erroneous determination process may be recovered by following determination processes. Therefore, even if a settling missing of the DAC or a decision error of the comparator is caused, a determination result may be correctly obtained when the following determination processes are succeeded.

Specifically, since the search procedure depicted in FIG. 3 may tolerate the decision error, although the number of cycles is increased, it is possible to shorten the cycle time and increase an overall speed thereof. Note that, various kinds of techniques, such as a non-binary search or a binary search where a redundancy determination is sandwich, may be considered.

Note that, in the redundant search or the like described above, a basic idea is that a redundancy is introduced in the search, by focusing on that a delay time of settling of the DAC (internal DAC) or the comparator constrains the cycle time. Therefore, though the number of cycles is increased, but the cycle time is shortened, so that a conversion may become a high speed.

Incidentally, for example, in the SAR-ADC (A/D converter) as described with reference to FIG. 1, a reference voltage (VREF in FIG. 1) is used. The reference voltage (VREF) determines the full scale of the A/D converter, and thus it is required for the reference voltage to include sufficiently stable against conversion accuracy.

Further, in the SAR-ADC, charges are removed from a node of the reference voltage due to its operation, so that a voltage fluctuation may occur at the reference voltage. The voltage fluctuation of the reference voltage may also cause a deterioration of the accuracy of the A/D conversion.

Note that the reference voltage of the SAR-ADC is required to stable supply with a desired accuracy, both of the cases that the reference voltage is supplied from an outside of a semiconductor integrated circuit, and that the reference voltage is supplied by integrated into the same silicon die for the SAR-ADC.

Further, as described above, the SAR-ADC may operate in a high-speed, for example, several tens to several hundred mega samples/second order, due to a miniaturization of manufacturing processes. Therefore, the operation speed of the SAR-ADC is steadily improved, however, a problem may be caused, for example, that a bandwidth of a package limits an operating speed of the SAR-ADC. Specifically, the above problem may be caused by, for example, that a device performance is improved by miniaturization of manufacturing processes, but a package size is not almost reduced.

Specifically, in a 12-bit SAR-ADC, for example, at least 12 times of determination processes may be necessary to obtain a 12-bit result by using a binary search. Further, in the case of requesting some cycles in addition to cycles for directly determining, for example, 20 clock cycles may be necessary to obtain the 12-bit result.

Therefore, for example, in order to achieve 50 MSPS by using an SAR-ADC (A/D converter) which requires 20 clock cycles for one conversion time, the clock frequency may be set to 1 GHz, i.e., a clock cycle time may be set to 1 ns. This means that the reference voltage supplied via the IC packages may be converged within 1 ns.

However, in the case of a typical low-cost IC package, a parasitic inductance of approximately 6 nH per pin may be present. Therefore, it is difficult to converge the reference voltage within 1 ns.

Further, in order to reduce the parasitic inductance, a package including a low parasitic inductance is used, however, a product cost may be increased when using the package including the low parasitic inductance.

Figure 4:
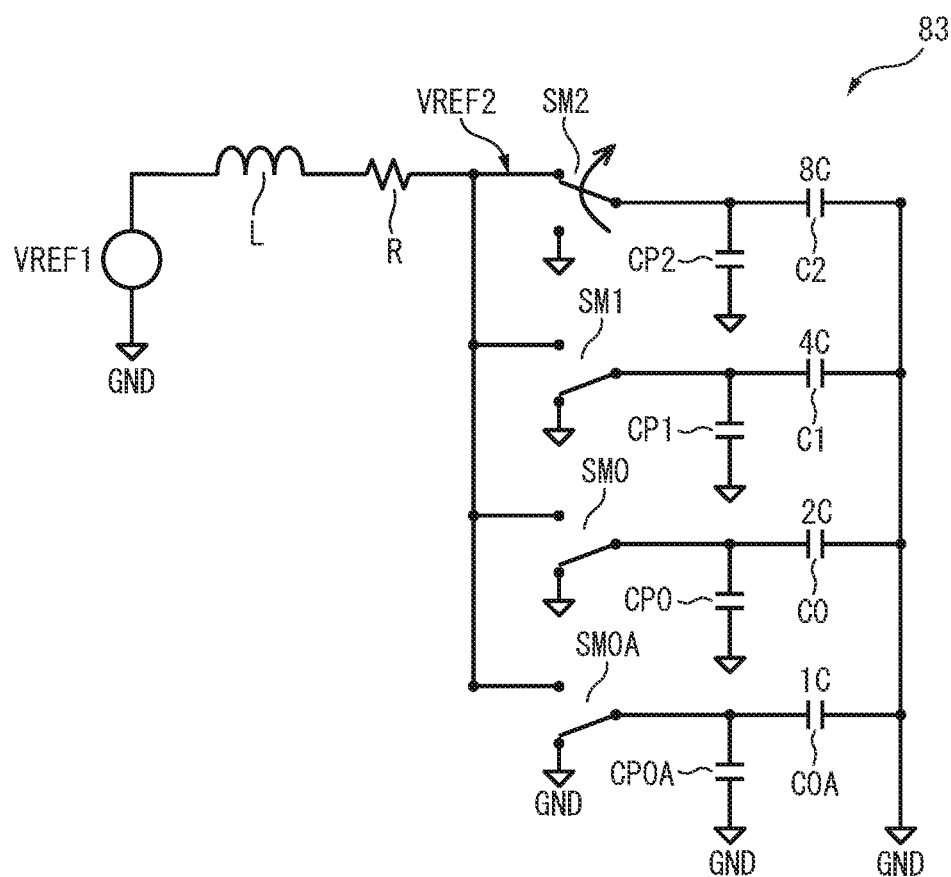
FIG. 4 is a diagram depicting an example of a circuit model including a package in the case of applying an example of an SAR-ADC in a semiconductor integrated circuit.

FIG. 4 is a diagram depicting an example of a circuit model including a package in the case of applying an example of an SAR-ADC in a semiconductor integrated circuit.

In FIG. 4, a reference sign VREF1 denotes an ideal reference voltage source and a voltage thereof, VREF2 denotes a reference voltage node on a silicon die (semiconductor integrated circuit) and a voltage thereof, and L denotes a bonding wire of a package and a parasitic inductance such as a frame and the like.

Further, a reference sign R denotes a parasitic resistance such as a bonding wire and frame of the package, SM0A, SM0, SM1, SM2 denote switches, C0A, C0, C1, C2 denote capacitive elements of a capacitor main DAC 83, and CP0A, CP0, CP1, CP2 denote parasitic capacitances of bottom plates of respective capacitive elements.

Note that FIG. 4 corresponds to a circuit depicted in FIG. 1 by adding a package model and removing elements which does not include strong relationship to the explanations. Nevertheless, note that capacitance values (relative capacitance values) of the respective capacitive elements C0A, C0, C1, C2 are set to 1C, 2C, 4C, 8C which are different from those of capacitive elements depicted in FIG. 1.

Incidentally, as described above, in the binary search, the search proceeds from high-order bits. Specifically, first, the switch SM2 is operated, so that the capacitance value 8C (capacitive element C2) is connected to the reference voltage node VREF2. In next operation, the switch SM1 is operated, so that the capacitance value 4C (capacitive element C1) is connected to the reference voltage node VREF2. Further, in after next operation, the switch SM0 is operated. Specifically, after switching the switch SM2 for the maximum capacitive element C2, the capacitance value of the capacitive element to be switched is gradually decreased.

Figure 5A:
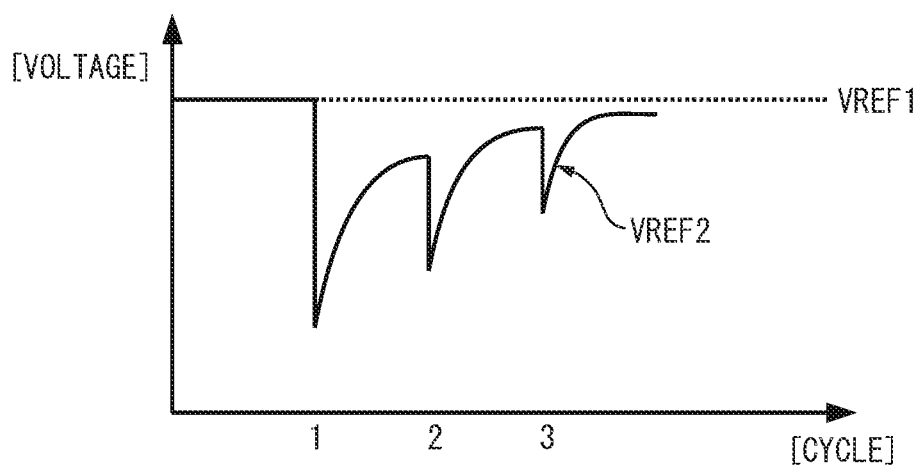
FIG. 5A and FIG. 5B are diagrams for explaining a fluctuation of the reference voltage caused by the parasitic inductance of the package.
Figure 5B:
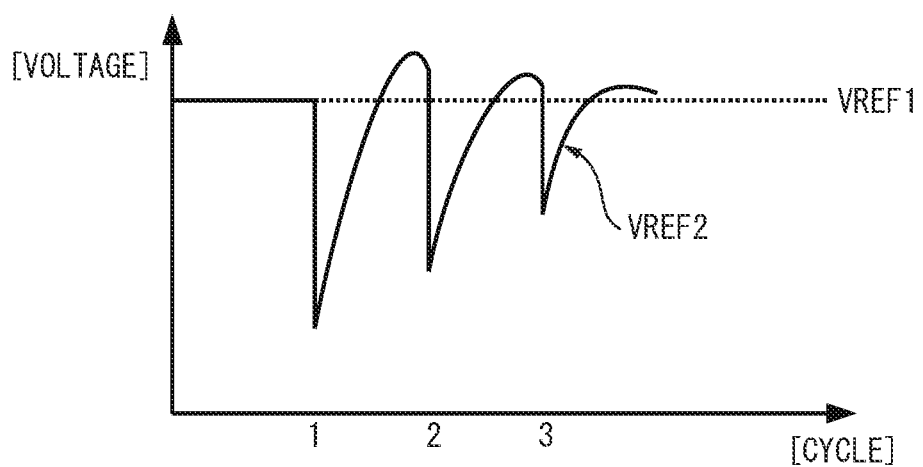

FIG. 5A and FIG. 5B are diagrams for explaining a fluctuation of the reference voltage caused by the parasitic inductance of the package. Here, FIG. 5A depicts an example of a voltage (reference voltage) VREF2 of a reference voltage node on a silicon die, and FIG. 5B depicts another example of the reference voltage VREF2 on the silicon die, together with depicting a voltage VREF1 of an ideal reference voltage source, respectively.

Specifically, FIG. 5A depicts the reference voltage VREF2 when a time constant of an RLC circuit is changed as gradually decreased, wherein the RLC circuit is constituted by the parasitic resistance R, the parasitic inductance L and the capacitance C depicted in FIG. 4. Further, FIG. 5B depicts the reference voltage VREF2 when the time constant of the RLC circuit is changed in terms of vibration.

As depicted in FIG. 5A and FIG. 5B, for example, when the SAR-ADC changes the value of the internal DAC (81, 82), a fluctuation may occur in the reference voltage (VREF2). The fluctuation of the reference voltage (reference fluctuation) is required to converge during a cycle time, and therefore if the cycle time is short with respect to a time constant of the RLC circuit, the reference voltage VREF2 may be incompletely converged. In that case, the output of the DAC (internal DAC) may include an error, so that an erroneous determination may be caused by the comparator CMP.

Here, as depicted in FIG. 5A and FIG. 5B, fluctuations of the reference voltage VREF2 caused by switching may be gradually consumed in accordance with progressing the search operations. This is because, in the binary search, a switching of a large capacity (C2) is performed in the first time, and a smaller capacity may be gradually connected.

With reference again to FIG. 4, the SAR-ADC (A/D converter) including a package will be explained with modeling an RLC series circuit. Concretely, for example, in the case that an inductance component is at 6 nH and a capacitance component is at 5 pF, a time constant of its critical condition may be at 173 Ps ($\approx$(6 nH×5 pF)$^{1/2}$).

Here, in the SAR-ADC including 12-bit resolution, a time for sufficiently settling an output of the DAC (internal DAC) may be considered as, for example, 10 times the time constant, e.g., 1.7 ns. Specifically, in this situation, it is difficult to operate the SAR-ADC when the cycle time is longer than 1.7 ns.

Therefore, for example, a problem that a supplying of the reference voltage VREF2 of the SAR-ADC (VREF) is not in time appears as a settling lack of the DAC. As described above, the problem of settling shortage of the DAC may be alleviated by the redundancy determination.

Nevertheless, in the redundant search, the number of clock cycles required for one conversion, for example, may be two times with respect to that required for an original binary search. Concretely, in a converter of 50 MSPS, when using 20 cycles for one conversion, a clock frequency in the original binary search may be set to 1 GHz.

However, for example, in order to use a double clock by the redundant search, the clock frequency may be set to 2 GHz. Note that, when the clock frequency is set to 2 GHz from 1 GHz, a consumption power of a clock tree used to supply a clock may be increased about twice, so that it is difficult to implement a clock distribution circuit.

Further, in the redundant search for a non-binary search, for example, a logic thereof may be complicated, further, in order to read out weight information of bits stored in a ROM (Read Only Memory), a reading time for reading from the ROM may limit a conversion speed. Specifically, a processing speed is delayed by using a circuit of deep logic, and it is not preferable for a converter requiring the maximum speed.

Furthermore, a search including a relief determination may use a large number of capacitive elements (e.g., 2000 capacitive elements for a 12-bit resolution single-ended A/D converter), causes an increase in circuit scale, and thus it is difficult to apply to a high-resolution ADC.

Further, in a top plate sampling wherein a sampling switch is connected to a top plate of a capacitor main DAC, for example, there is a problem that an input bandwidth may be changed by a voltage of an input signal, so that a distortion may be caused, and therefore, for example, it is difficult to apply to a 12-bit converter.

Furthermore, for example, it is considered that a reference buffer is provided on a silicon die so as to alleviate the problem of insufficient bandwidth of the package, however, the addition of the reference buffer may lead to an increase in silicon area and consumption power. Further, the reference buffer is an amplifier in fact, advantages of the SAR-ADC, i.e., the amplifier is not required and is preferable for a fine process, may be lost.

Consequently, in the A/D converter (SAR-ADC), various problems to be solved may be present, and therefore, for example, it is required to realize a low voltage and a high-speed operation, and compensate a decision error caused by comparing an input signal voltage with an output of the internal DAC.

Figure 6:
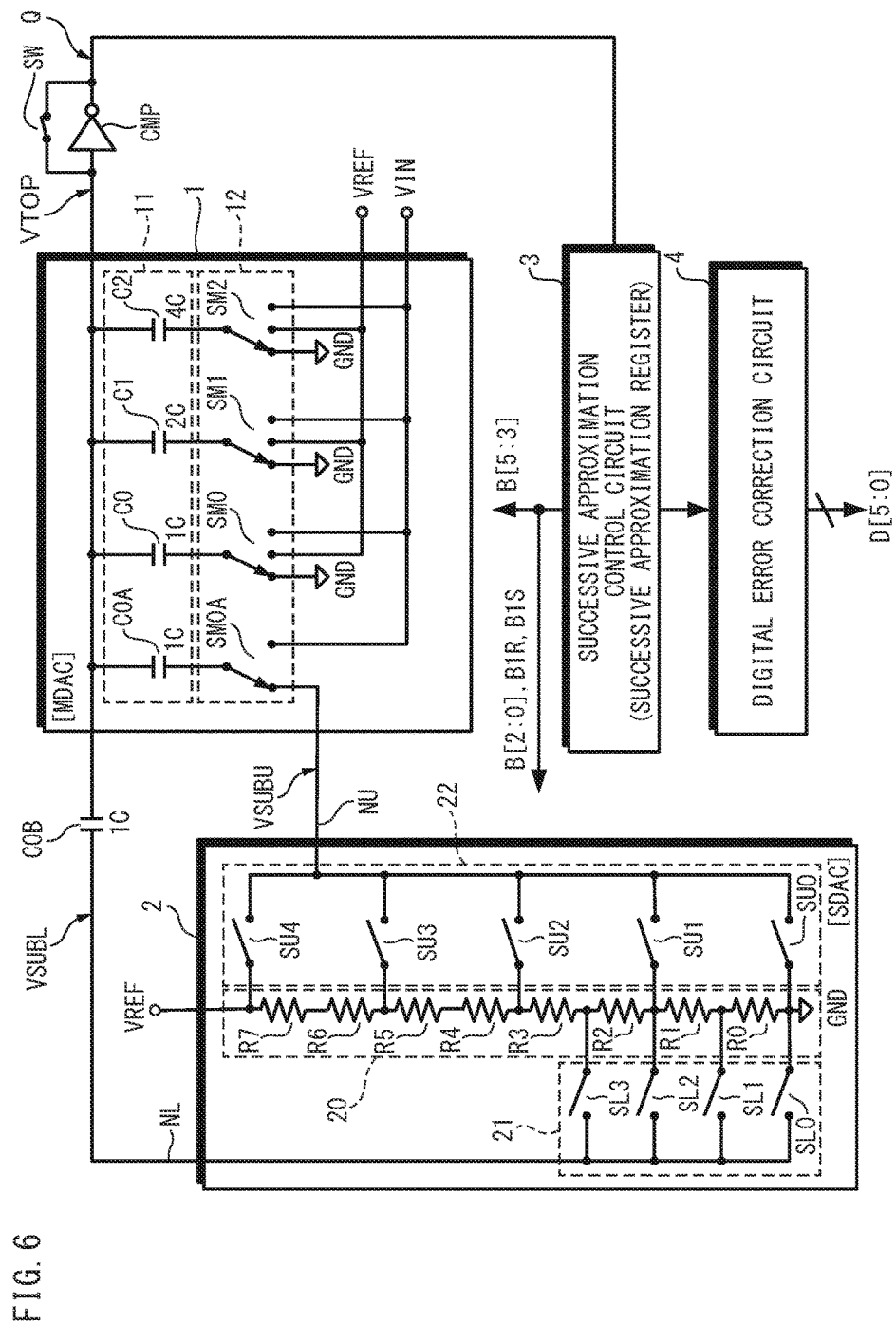
FIG. 6 is a block diagram depicting a first embodiment of an A/D converter (SAR-ADC)

Below, embodiments of an A/D converter, an A/D conversion method and a semiconductor integrated circuit will be described in detail with reference to the accompanying drawings. FIG. 6 is a block diagram depicting a first embodiment of an A/D converter, more specifically depicts an example of the A/D converter (SAR-ADC). Note that FIG. 6 depicts a 6-bit resolution SAR-ADC in order to simplicity of explanations.

In FIG. 6, a reference sign 1 denotes a capacitor main DAC (MDAC), 2 denotes a resistor sub DAC (SDAC), 3 denotes a successive approximation control circuit (successive approximation register), 4 denotes a digital error correction circuit, and CMP denotes a comparator. The capacity main DAC (capacitor DAC) 1 and the resistor sub DAC (resistor DAC) 2 constitute an internal DAC.

Further, reference signs C0A, C0, C1, C2 denote capacitive elements, 1C, 1C, 2C, 4C denote relative magnitudes of capacitance values of respective capacitive elements, SM0A, SM0, SM1, SM2, SU0 to SU4, SL0 to SL3 and SW denote switches, and R0 to R7 denote resistive elements.

Further, a reference sign Q denotes an output node of the CMP and a signal value thereof, B[5: 0] denote an input digital code (control signal) of the internal DAC, B1R, B1S denote redundant bits (control bits), NL, NU denote output nodes of the resistor sub DAC 2, and VSUBL, VSUBU denote output voltages of the resistor sub DAC 2.

Furthermore, reference sign COB denotes a capacitive element (first capacitive element), D[5: 0] denotes a 6-bit output digital code, VIN denotes an analog input node and its voltage, VREF denotes a reference voltage node and its voltage, and VTOP denotes an output node of the capacitor main DAC 1 and its voltage. Here, the capacitor main DAC 1 converts high-order 3 bits ([5 3]; M bits), and the resistor sub DAC 2 converts low-order 3 bits ([2 0]; N bits).

As depicted in FIG. 6, the 3-bit capacitor main DAC 1 for converting high-order bits includes a capacitor circuit 11 including a plurality of capacitive elements C0A, C0, C1, C2 which store charges by sampling the analog input voltage (input signal voltage) VIN, and a first switch circuit 12.

The first switch circuit 12 includes a plurality of switches SM0A, SM0, SM1, SM2 corresponding to the capacitor elements C0A, C0, C1, C2, and the switches SM0A, SM0, SM1, SM2 are controlled by high-order 3 bits B[5: 3] of a 6-bit digital code B[5: 0] output from the successive approximation control circuit 3.

As apparently depicted from a comparison of FIG. 6 and above described FIG. 1, the capacitor main DAC 1 in the SAR-ADC (A/D converter) of the first embodiment includes the same configurations as the capacitor main DAC 81 depicted in FIG. 1.

The 3-bit resistor sub DAC 2 for converting low-order bits includes a resistor string (resistor circuit) 20 including a plurality of resistive elements R0 to R7 connected in series between the reference voltage node VREF and the ground GND, a second switch circuit 21, and a third switch circuit 22.

The second switch circuit 21 includes switches SL0, SL1, SL2, SL3, and select one node from a ground node (GND), a connection node of R0 and R1, a connection node of R1 and R2, and a connection node of R2 and R3 of the resistive elements R0 to R7, and outputs a voltage of the selected node to a node NL as an output (first voltage VSUBL).

The third switch circuit 22 includes switches SU0, SU1, SU2, SU3, SU4, and select one node from GND, a connection node of R3 and R4, a connection node of R4 and R5, a connection node of R5 and R6, and the reference voltage (VREF), and outputs a voltage of the selected node to a node NU as an output (second voltage VSUBU).

Note that the switches SL0 to SL3 of the second switch circuit 21, and the switches SU0 to SU4 of the third switch circuit 22 are controlled by the low-order 3 bits B[2: 0] and the control bits B1R, B1S from the successive approximation control circuit 3.

Here, in the two output nodes NL and NU of the resistor sub DAC 2, one output node NL is connected to the top plate VTOP of the capacitive elements C0A, C0, C1, C2 of the capacitor main DAC 1 through the capacitive element COB.

Specifically, the one output node NL is applied with the first voltage VSUBL selected by the second switch circuit 21, and thus the first voltage VSUBL is applied to the top plate VTOP of the respective capacitors C0A, C0, C1, C2 through the capacitive element COB.

Further, the other output node NU is applied with the second voltage VSUBU selected by the third switch circuit 22, and connected to one input of the switch SM0A for controlling connection of the capacitive element (second capacitive element) C0A. Specifically, the second voltage VSUBU is applied to the one input of the switch SM0A. Note that the other input of the switch SM0A is applied with the input signal voltage VIN, and the second voltage VSUBU or the input signal voltage VIN is selected by switching of the switch SM0A.

The digital error correction circuit 4 receives an SAR output including a result of a redundancy determination from the successive approximation control circuit 3, converts into a binary code, and outputs an output digital code D[5: 0] (6-bit digital code of A/D converting the input signal voltage VIN).

Figure 7A:
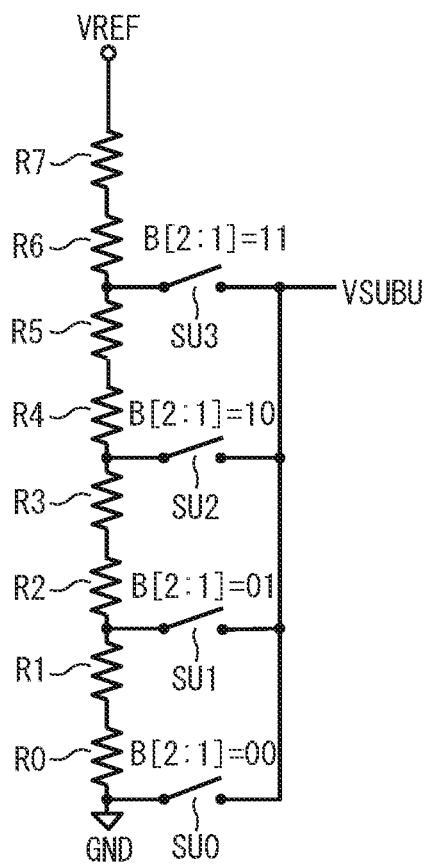
FIG. 7A and FIG. 7B are diagrams for explaining an operation of a sub DAC in the SAR-ADC depicted in FIG. 6.
Figure 7B:
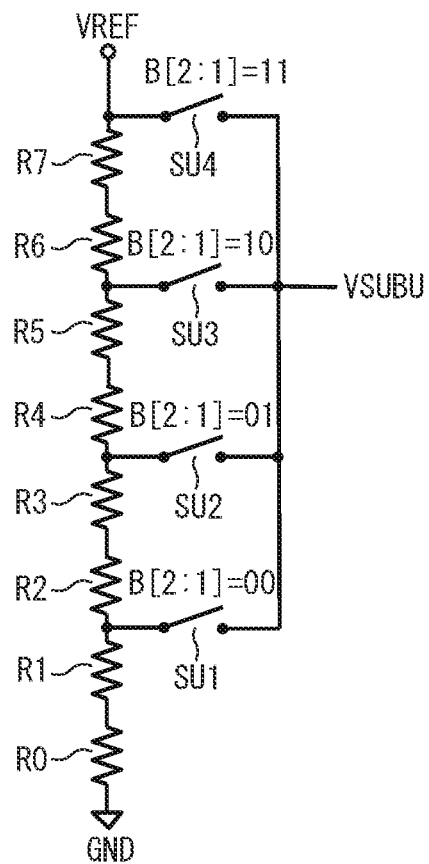

FIG. 7A and FIG. 7B are diagrams for explaining an operation of a sub DAC (resistor sub DAC) in the SAR-ADC depicted in FIG. 6. Here, FIG. 7A depicts the resistor sub DAC 2 when a signal B1R from the successive approximation control circuit 3 is at "0" (B1R=0), and FIG. 7B depicts the resistor sub DAC 2 when the signal B1R from the successive approximation control circuit 3 is at "1" (B1R=1).

As depicted in FIG. 7A, the third switch circuit 22 for generating a second voltage VSUBU uses a voltage based on the switches SU0 to SU3 when B1R=0, and uses a voltage based on the switches SU1 to SU4 when B1R=1.

Specifically, the switches controlled by a 2-bit input digital code B[2: 1] from the successive approximation control circuit 3 are controlled as: in the case that the control bit B1R=0, the switch SU0 is selected when the 2-bit input digital code B[2: 1] is "00", SU1 is selected when B[2: 1] is "01", SU2 is selected when B[2: 1] is "10", and SU3 is selected when B[2: 1] is "11".

Further, in the case that the control bit B1R=1, SU1 is selected when B[2: 1] is "00", SU2 is selected when B[2: 1] is "01", SU3 is selected when B[2: 1] is "10", and SU4 is selected when B[2: 1] is "11". Therefore, in the case of B1R=1, one stage higher voltage than that of B1R=0 is selected and output as the second voltage VSUBU.

FIG. 8A and FIG. 8B are diagrams for explaining the operation of the SAR-ADC depicted in FIG. 6 in comparison with an operation of the SAR-ADC depicted in FIG. 1. Here, FIG. 8A depicts an operation of the SAR-ADC depicted in FIG. 1, and FIG. 8B depicts an operation of the SAR-ADC depicted in FIG. 6.

As apparently depicted from a comparison of FIG. 8A and FIG. 8B, in the SAR-ADC of the first embodiment depicted in FIG. 6, the second voltage VSUBU may be set to one step different potentials divided by the resistive elements R0 to R7 based on the signal B1R is at "1" or "0".

Specifically, as depicted in FIG. 8A, in the binary search of the SAR-ADC depicted in FIG. 1, for example, if a decision error of the comparator CMP is caused at a third cycle, the decision error caused in the third cycle is not compensated in subsequent fourth and fifth cycles, so that the decision error may be included in the final result.

In contrast, as depicted in FIG. 8B, in the SAR-ADC of the first embodiment, even if a decision error of the comparator CMP is caused at the third cycle, for example, after determining high-order 5 bits using 5 cycles, a redundancy determination of one cycle may be performed in a sixth cycle.

Specifically, as depicted in FIG. 8B, in the SAR-ADC of the first embodiment, the least significant bit decision is performed in the redundancy determination of the sixth cycle, so that the decision error of one bit caused in the third cycle may be compensated. Note that, in FIG. 8B, a state transition caused by the redundancy determination is indicated by a dotted line.

Therefore, for example, if the decision error is caused in the third cycle, in the SAR-ADC depicted in FIG. 1, an error may be included in the final result, however, in the SAR-ADC of the first embodiment depicted in FIG. 6, the decision error caused in the third cycle may be compensated (recovered) by the redundancy determination.

In accordance with another viewpoint, in processes in the SAR-ADC of the first embodiment depicted in FIG. 8B, the final result (e.g., the sixth cycle) includes two path. Therefore, a decision error, which is caused earlier than a redundancy determination, may be compensated by a redundant path, and the final result may be correct.

Next, with reference to FIG. 6, FIG. 7A and FIG. 7B described above, operations of the SAR-ADC of the first embodiment will be described in detail.

A voltage output from the third switch circuit 22 of the resistor sub DAC 2, i.e., the second voltage VSUBU generated at the output node NU may be controlled by an input digital code B[2: 1] from the successive approximation control circuit 3 and a control bit B1R, and expressed as follows:

| B1R | B[2:1] | VSUBU |
|---|---|---|
| "0" | "00" | 0/8 × VREF |
| "0" | "01" | 2/8 × VREF |
| "0" | "10" | 4/8 × VREF |
| "0" | "11" | 6/8 × VREF |
| "1" | "00" | 2/8 × VREF |
| "1" | "01" | 4/8 × VREF |
| "1" | "10" | 6/8 × VREF |
| "1" | "11" | 8/8 × VREF |

As described above, when B1R=0, the second voltage VSUBU is determined as VSUBU=B[2: 1]× become 2/8× VREF, if B1R=1, VSUBU=B[2: 1]×2/8×VREF+2/8×VREF. Specifically, the control bit B1R is considered as a signal for increasing the second voltage VSUBU by 2/8×VREF.

Further, the second voltage VSUBU may be controlled by the input digital code B[2: 1] and the control bit B1R, and more specific operations will be described with reference to FIG. 7A and FIG. 7B. As described above, FIG. 7A depicts the case of B1R=0, and FIG. 7B depicts the case of B1R=1.

As apparently depicted from a comparison of FIG. 7A and FIG. 7B, in the case of B1R=1, a resistor string (resistor row) is shifted toward to a reference voltage VREF by $\frac{2}{8} \times$VREF, with regard to the resistor string used in the case of B1R=0.

Here, a first voltage VSUBL may be controlled by an input digital code B[0] and a control bit B1S, and expressed as follows:

| B1S | B[0] | VSUBL |
|---|---|---|
| "0" | "0" | 0/8 × VREF |
| "0" | "1" | 1/8 × VREF |
| "1" | "0" | 2/8 × VREF |
| "1" | "1" | 3/8 × VREF |

As described above, when B1S=0, the first voltage VSUBL is determined as VSUBL=B[0]/8×VREF, and when B1S=1, the first voltage VSUBL is determined as VSUBL=B[0]/8×VREF+$\frac{2}{8}$×VREF. Specifically, the control bit B1S is considered as a signal for increasing the first voltage VSUBL by $\frac{2}{8}$×VREF.

In the case of A/D converting an input signal voltage VIN by the SAR-ADC depicted in FIG. 6, first, an input signal voltage VIN is sampled. Specifically, switches SM0A, SM0, SM1, SM2 of the capacitor main DAC 1 are connected to VIN, and a switch SW is connected (closed). Here, a 6-bit code (input digital code) B[5: 0] and control bits B1R, B1S are set to B=000000 and B1R=0, B1S=1.

Therefore, a bottom plate of a capacitor circuit 11 of the capacitor main DAC 1 is applied with the input signal voltage VIN, a top plate VTOP is applied with a threshold voltage VT of a comparator CMP, and a bottom plate of a capacitive element COB is applied with VSUBL=$\frac{2}{8}$×VREF. After that, when opening the switch SW, a sampling operation of VIN is completed, and the sampled charge Q is expressed as follows:

$$Q=(VT-VIN) \times 8C+(VT-\tfrac{1}{2} \times VREF) \times C$$

Next, in order to determine the most significant bit, the input digital code B[5: 0] and the control bits B1R, B1S are set to B=100000 and B1R=0, B1S=1.

| B | B1R | B1S |
|---|---|---|
| "100000" | "0" | "1" |

Specifically, in the initial state of the SAR-DAC, the second voltage VSUBU is set without adding $\frac{2}{8}$×VREF by setting the control bit B1R as B1R=0, and VSUBU is set with adding $\frac{2}{8}$×VREF by setting the control bit B1S as B1S=1. As a result, when connecting the switch SM2 to the reference voltage node VREF, the top plate VTOP is expressed as follows:

$$VTOP=VT-(VIN-\tfrac{1}{2} \times VREF) \times \tfrac{8}{9}$$

The above equation indicates that a potential of the top plate VTOP is lower than the threshold voltage VT when VIN>$\frac{1}{2}$×VREF, and VTOP is higher than VT when VIN<$\frac{1}{2}$×VREF. Specifically, an output Q of the comparator CMP is at "0" when the input voltage is higher than the threshold VT, and at "1" when the input voltage is lower than the threshold VT. Therefore, the input signal voltage VIN is determined whether higher or lower than a half of the reference voltage VREF, and a value obtained by inverting the value of the output Q is determined as the most significant bit of B.

Next, a second bit from second bit from the high-order B is determined. Here, the most significant bit of B is already determined, and the second bit from the top of B is set to "1".

| B | B1R | B1S |
|---|---|---|
| "100000" | "0" | "1" or |
| "110000" | "0" | "1" |

By the above operations, a voltage of the top plate VTOP is determined as follows:
when the most significant bit is already determined to "1"

$$VTOP=VT-(VIN-\tfrac{3}{4} \times VREF) \times \tfrac{8}{9}$$

when the most significant bit is already determined to "0"

$$VTOP=VT-(VIN-\tfrac{1}{4} \times VREF) \times \tfrac{8}{9}$$

Specifically, the second bit from the top of B is determined whether a voltage of VTOP is higher or lower than the threshold voltage VT by the comparator CMP. Thereafter, the similar processes may be performed until B[2].

Next, a further determination is performed by setting a value of bit B[1] to "1", and a determination result of B[1] is determined to "0" or "1". Note that, when B[1] is determined to "1", the control bit B1R is changed from "0" to "1", and $\frac{2}{8}$×VREF is added to the second voltage VSUBU. This operation corresponds to the case of a rising redundant path depicted by a dotted line in FIG. 8B described above.

Further, when B[1] is determined to "0", the control bit B1R is maintained to "0", no effect may be applied to the top plate VTOP. Note that, since B[1], which is previously set to "1" so as to performed a determination, is returned to "0". This operation corresponds to the case of a falling redundant path depicted by a dotted line in FIG. 8B. Here, determination results obtained in this stage will coincide, since the determination results are reflected in both B1R and B[1].

Further, a determination is performed again, and a value B1S may be determined. Here, if the result is at "0", B1S is changed from "1" to "0", and if the result is at "1", B1S is maintained to "1". Therefore, when the result is at "0", the first voltage VSUBL may be decreased by $\frac{2}{8}$×VREF.

Finally, in order to determine a value of B[0], B[0] is set to "1" and a determination is performed. In accordance with the above operations, all bits of B[5: 0], B1R B1S may be determined. The following operation (equation) may be performed in order to obtain a final binary code.

$$D=B+2 \times B1R-2 \times (!B1S)$$

In the above equation, first and second terms are the same as those of the binary search without redundancy (SAR-ADC depicted in FIG. 1), and a third term is newly added. Specifically, the digital error correction circuit 4 of the SAR-ADC according to the first embodiment calculates the final result by considering the third term.

The operations of the SAR-ADC according to the first embodiment depicted in FIG. 6 are described above, the 6-bit SAR-ADC is only an example for the purpose of simplifying the explanation, and it may be applied to an A/D converter including an optional resolution.

Further, the SAR-ADC depicted in FIG. 6 is an example for realizing the 6-bit conversion by 7 cycles, the redundancy determinations may be repeatedly any number of times. In addition, it is possible to sandwich the redundancy determination in any position. Further, the above-mentioned embodiment is explained by a single-ended configuration, however, it also possible of course to apply a differential configuration.

As described above, according to the SAR-ADC (A/D converter) of the present embodiment, the number of relief determinations may be added, and a converter including a possible number of cycles may be realized. Further, according to the SAR-ADC of the present embodiment, fluctuation of the reference voltage VREF is simply reduced by ½ in each time of the determination process, and therefore, in the latter half of the determination, the fluctuation of VREF becomes very small. Furthermore, in the redundancy determination, the resistor sub DAC 2 is utilized, charges subtracted from the reference voltage VREF may be a necessary minimum, and it is possible to reduce an error in the A/D conversion.

Further, according to the present embodiment, the search logic only requires a simple extension of the binary search, and therefore a high speed operation A/D converter may be realized without including a problem of a low speed operation caused by a deep logical search.

In addition, according to the present embodiment, since the number of converted bits is divided by the capacitor main DAC and the resistor sub DAC, and the number of capacitive elements is arbitrarily determined, so that the problem of increasing a circuit scale may be overcome. Further, according to the present embodiment, it is possible to realize a transformation including a repair decision for a high resolution A/D converter of using a bottom plate sampling method.

Figure 9:
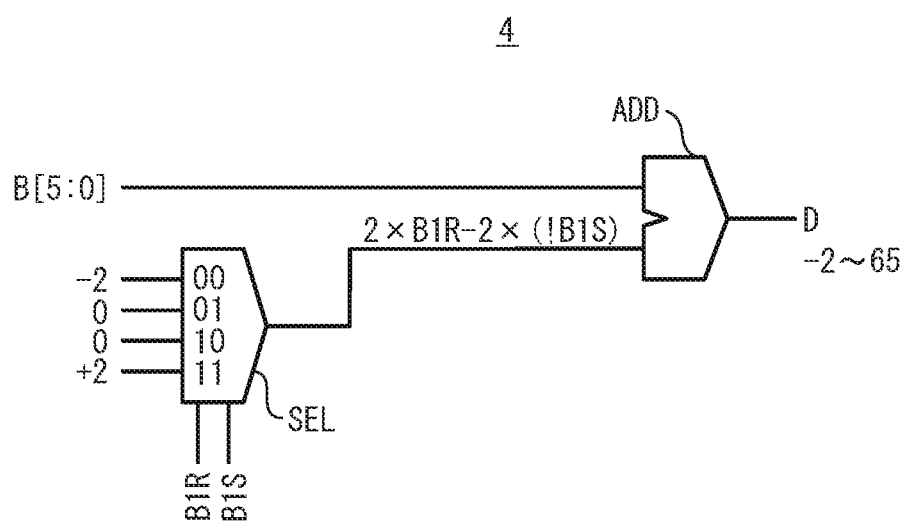
FIG. 9 is a diagram depicting an example of a digital error correction circuit in SAR-ADC depicted in FIG. 6.

FIG. 9 is a diagram depicting an example of a digital error correction circuit in SAR-ADC depicted in FIG. 6. In FIG. 9, a reference sign ADD denotes an adder, SEL denotes a selector. Further, a reference sign B[5: 0] denotes an input digital code (control signal) of an internal DAC, B1R, B1S denote redundant bits (control bits), and D−2 to 65 (D[5: 0]) denotes an output digital code (binary codes of an A/D conversion result).

As depicted in FIG. 6, the digital error correction circuit 4 includes the adder ADD and the selector SEL. As described above, a binary code B of the A/D conversion result may be obtained by the following equation:

$$D=B+2\times B1R-2\times(!B1S)$$

Specifically, in the example of the digital error correction circuit 4 depicted in FIG. 9, second and third terms are produced by a four-input selector SEL, and a first term is added by the adder ADD, so that a final binary code (output digital code) D may be obtained.

Further, in the example of FIG. 9, D may be a range of −2 to 65. Specifically, an 6-bit output digital code of the A/D converter is a range of 0 to 63, however, in the present embodiment, redundant bits are added, so that the final binary code D (−2 to 65) is slightly larger than the output digital code (0 to 63). Note that, if a redundant component included in the final result is not required, and the bits corresponding to the redundant component are deleted, it is of course that a 6-bit result (0 to 63) may be obtained.

Figure 10:
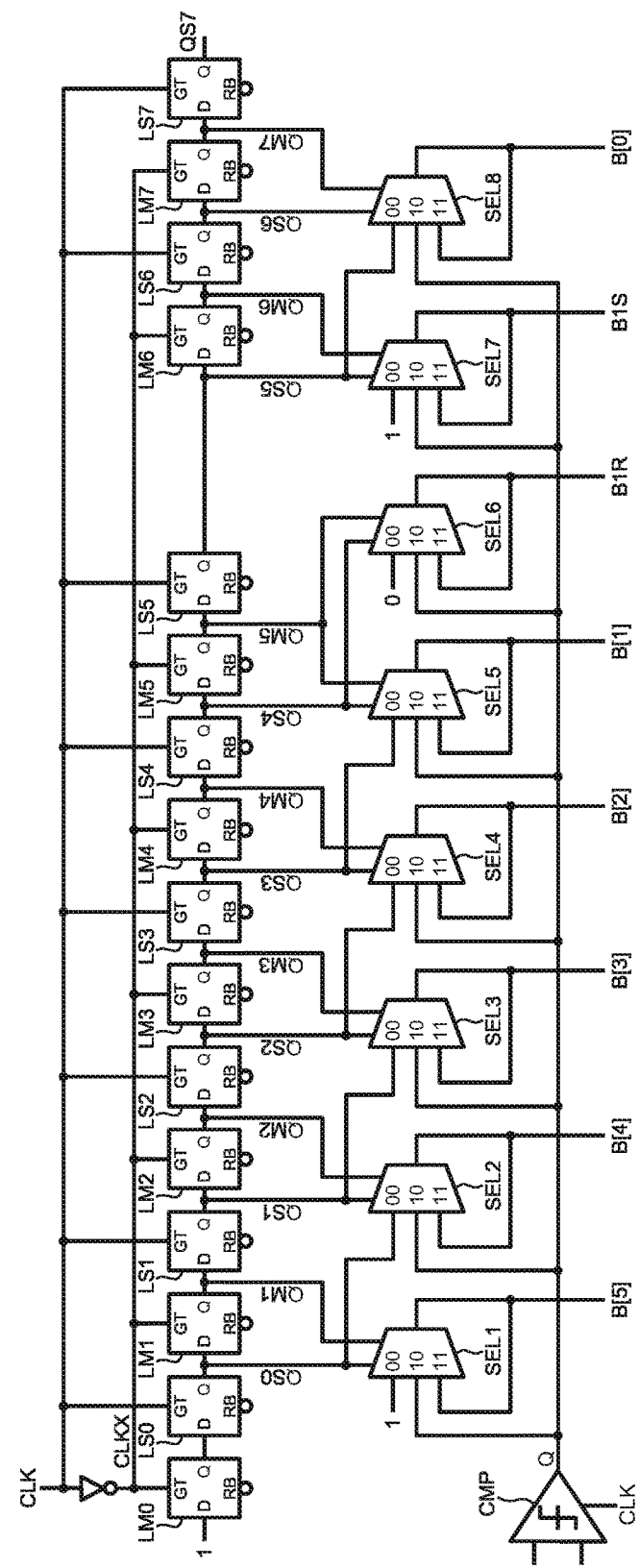
FIG. 10 is a diagram depicting an example of a successive approximation control circuit in SAR-ADC depicted in FIG. 6.
Figure 11:
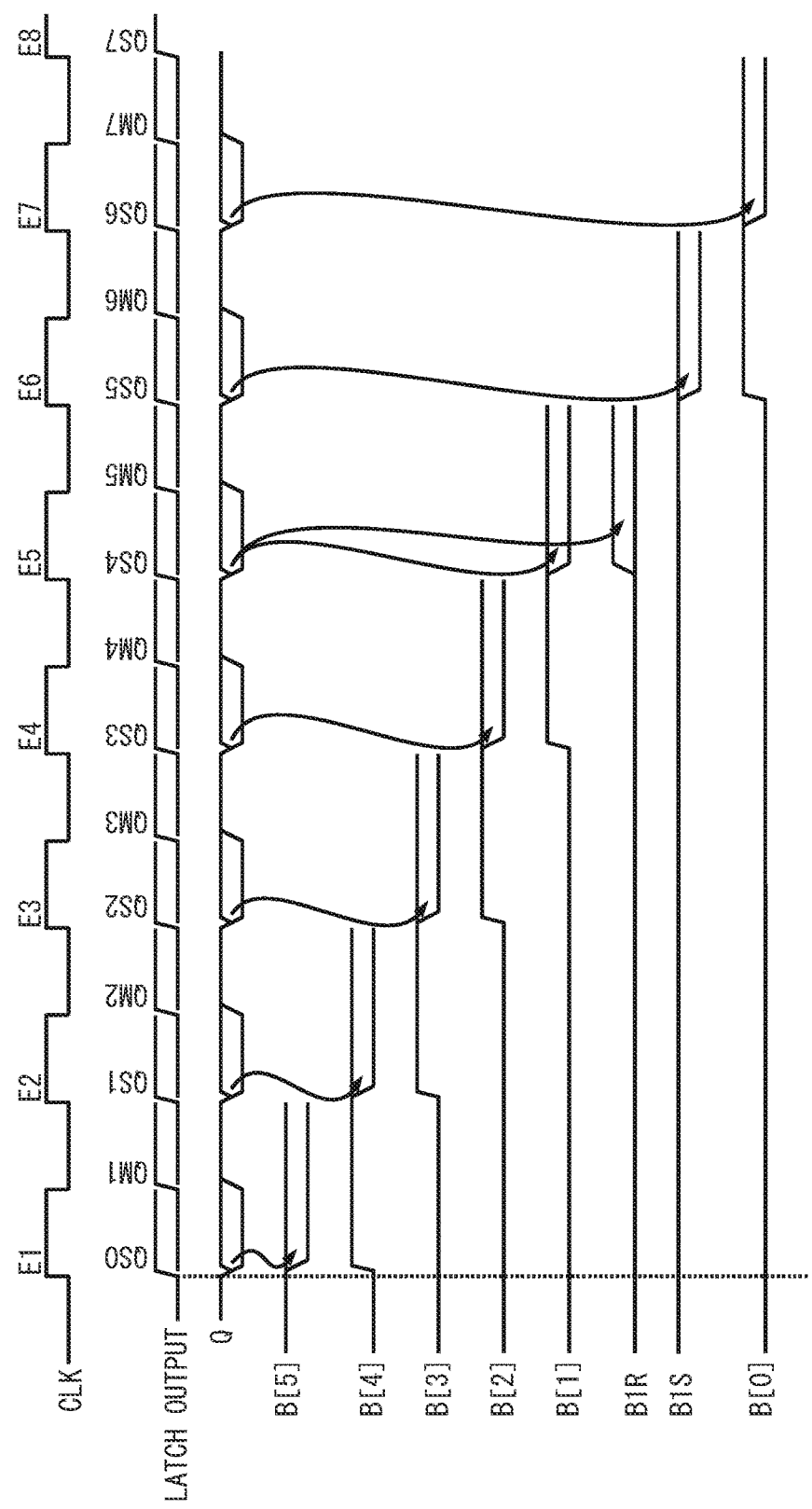
FIG. 11 is a diagram for explaining an example of an operation of the successive approximation control circuit depicted in FIG. 10.

FIG. 10 is a diagram depicting an example of a successive approximation control circuit in SAR-ADC depicted in FIG. 6, and FIG. 11 is a diagram for explaining an example of an operation of the successive approximation control circuit depicted in FIG. 10. Next, with reference to FIG. 10 and FIG. 11, an example of a successive approximation control circuit (successive approximation register) 3 and operations thereof will be explained.

In FIG. 10, a reference sign CLK denotes a clock signal; CLKX an inverted signal of CLK; LM0 to LM7, LS0 to LS7 denote D-latches; QS0 to QS7, QM1 to QM7 denote output nodes of the latches; and SEL1 to SEL8 denote selectors. Further, reference signs B[5] to B[0], B1R, B1S denote signals for controlling the internal DAC (capacitor main DAC 1 and resistor sub DAC 2), and CMP denotes a comparator.

In the successive approximation control circuit 3 depicted in FIG. 10, the comparator CMP performed a determination and maintains (holds) the determined value when the clock CLK becomes "1", and an output Q is at "1" when the CLK becomes "0". Incidentally, it is possible to apply various ones as the CMP.

In FIG. 10, the D-latches LM0 to LM7 and LS0 to LS7 propagate input values D (Q=D) when an input GT of each of the D-latches becomes "1", and hold the output Q when the GT becomes "0". Further, the output Q becomes cleared to "0" when an input (reset input) RB is at "0".

In an initial state of being cleared by RB of the successive approximation control circuit 3 depicted in FIG. 10, B[5: 0]=100000, B1R=0, and B1S=1. Here, the D-latches are connected in series as a line, in the case that RB is released (RB=1), "1" is propagated to the output Q of the D-latch LM0 the next when CLK=1, LM0 holds "1", and "1" is propagated to the output Q of the D-latch LS0 the next when CLK=0.

Here, an inverted clock signal CLKX is input to the D-latches LM0 to LM7, and a clock signal CLK is input to the D-latches LS0 to LS7, as depicted in FIG. 11, "1" is propagated in synchronization with both rising and falling edges of the clock signal CLK (CLKX).

After RB is released, an output node QS0 of the D-latch LS0 becomes "1" (QS0=1) at a clock edge E1, as depicted in FIG. 11. Thus, the selector SEL1 selects an input "10", so that a determination result Q of the comparator CMP is propagated to an output of the selector SEL1.

Therefore, the selector SEL1 selects an input "11", the input and the output are connected and the value is held, so that B[5] is determined. Further, at the clock edge E1, a selector SEL2 also operate in parallel with SEL1. Specifically, when QS0=1, the selector SEL2 selects the input "00", so that B[4]=1 is output.

Next, at the time of a clock edge E2, an output node QS1 of the D-latch LS1 becomes "1" (QS1=1). Thus, the selector SEL2 selects an input "10", so that the determination result Q of the comparator CMP is propagated to an output of the selector SEL2. Further, after a half cycle of the clock edge E2, the selector SEL2 selects an input "11" when CLK=0. Therefore, the selector SEL2 selects an input "11", the input and the output are connected and the value is held, so that B[4] is determined.

Below, the same processing may be performed until the value of B[1] is determined. Next, at the time of a clock edge E5, the value of Q is written to SEL5, so that the value of B[1] is determined. At the same time, the same value is written to SEL6. This means that the determination results by the comparator CMP are reflected in both B1R and B[1].

Further, at the time of a clock edge E6, the value of Q is written to a selector SEL7 where an initial value is at "1". Specifically, when Q is at "1", B1S is not changed and maintains at "1", and when Q is at "0", B1S is changed from "1" to "0". Furthermore, at the same time, B[0]=1 by a selector SEL8. Therefore, at the time of a clock edge E7, the value of Q is written to a selector SEL8, and all determination may be completed.

In accordance with the above descriptions by the example of the successive approximation control circuit 3 and operations thereof in the SAR-ADC of the first embodiment, by applying the present embodiment, the search logic is realized by a simple extension of the binary search, and therefore a problem of a high speed may be overcome.

For example, in the first embodiment depicted in FIG. 6, a high speed operation is required in paths from an output signal Q of a comparator CMP to B[5: 0], B1R, B1S, and these paths may be realized by one stage of 3-input selectors as depicted in FIG. 10. As a result, a high-speed A/D conversion operation may be achieved.

Figure 12:
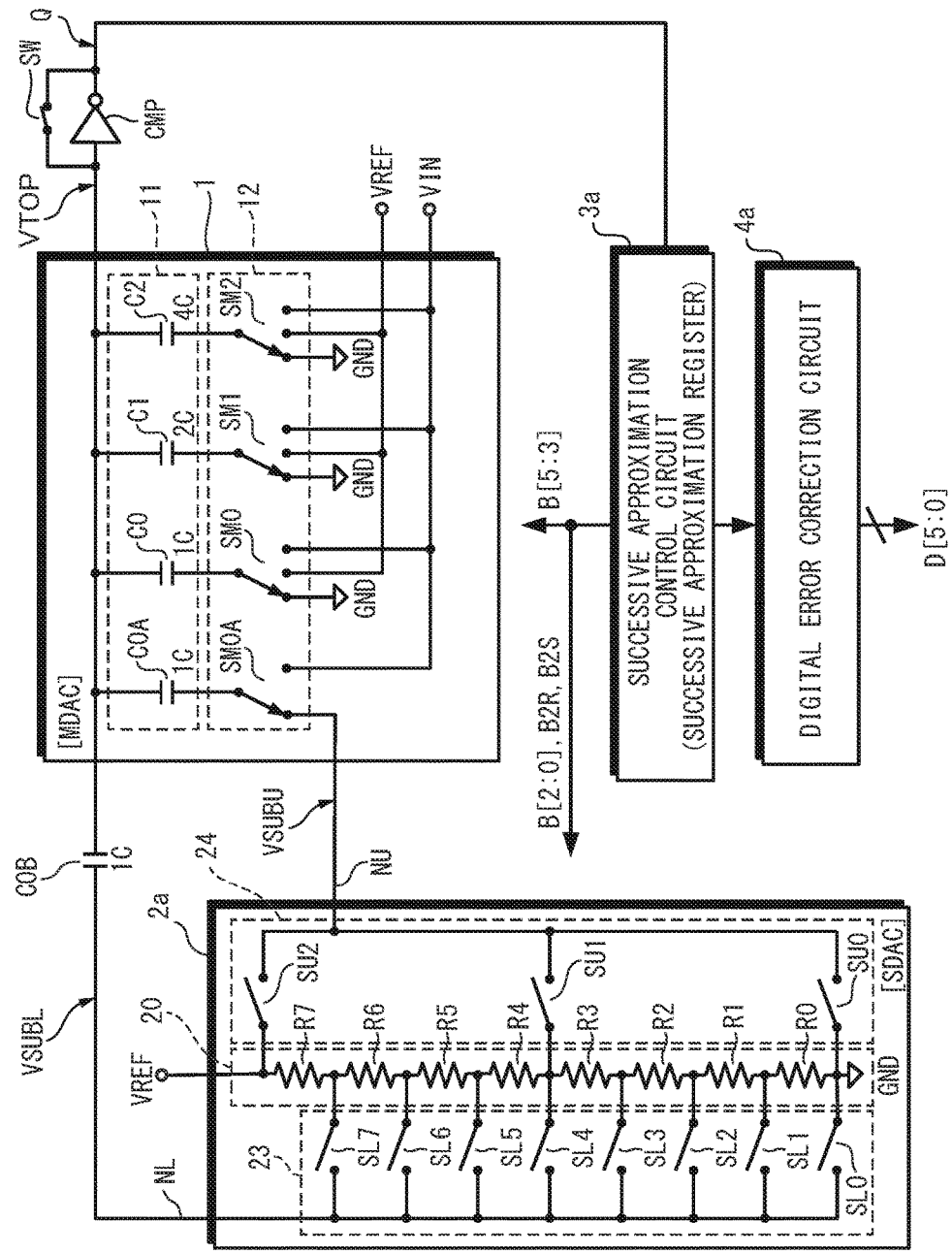
FIG. 12 is a block diagram depicting a second embodiment of the SAR-ADC.
Figure 13:
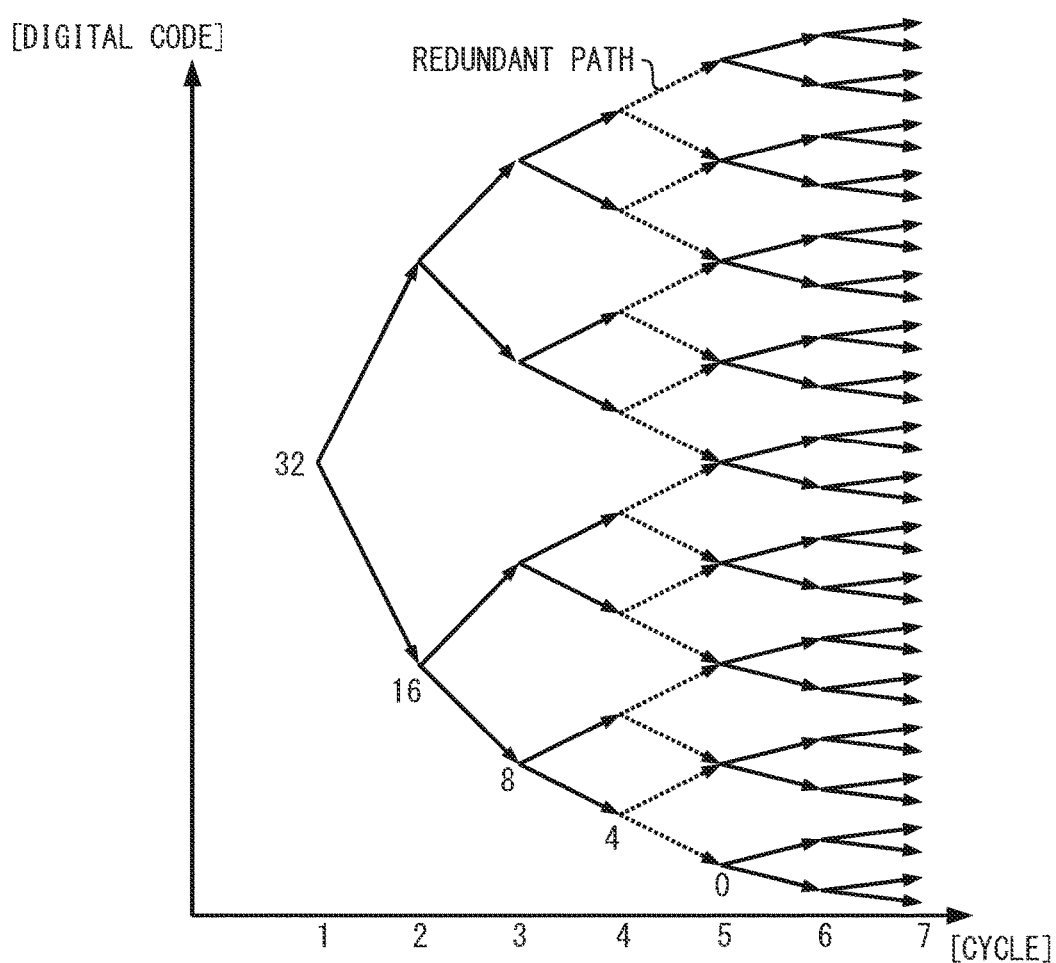
FIG. 13 is a diagram for explaining an operation of the SAR-ADC depicted in FIG. 12.

FIG. 12 is a block diagram depicting a second embodiment of the SAR-ADC, and FIG. 13 is a diagram for explaining an operation of the SAR-ADC depicted in FIG. 12. As apparently depicted from a comparison of FIG. 12 and above described FIG. 6, a resistor sub DAC 2a in an SAR-ADC of the second embodiment is different from the resistor sub DAC 2 in the SAR-ADC of the first embodiment.

Specifically, as depicted in FIG. 12, in the SAR-ADC of the second embodiment, configurations of a second switch circuit 23 and a third switch circuit 24 are different from those of the second switch circuit 21 and the third switch circuit 22 of the SAR-ADC of the first embodiment.

Here, in the SAR-ADC of the first embodiment depicted in FIG. 6, the redundancy determination is performed in a fifth cycle, however, in the SAR-ADC of the second embodiment depicted in FIG. 12, the redundancy determination is performed in a fourth cycle.

Note that, in order to perform the redundancy determination in the fourth cycle, a second voltage VSUBU of the resistor sub DAC 2a is increased by $\frac{1}{2} \times$VREF in accordance with a control bit B2R. Specifically, the second voltage VSUBU is controlled by an input digital code B[2] from the successive approximation control circuit 3a and a control bit B2R, and may be expressed as follows:

| B2R | B[2] | VSUBU |
| --- | --- | --- |
| "0" | "0" | 0/8 × VREF |
| "0" | "1" | 4/8 × VREF |
| "1" | "0" | 4/8 × VREF |
| "1" | "1" | 8/8 × VREF |

As described above, when B2R=0, the second voltage VSUBU is determined as VSUBU=B[2]×$\frac{4}{8}$×VREF, and when B2R=1, the second voltage VSUBU is determined as VSUBU=B[2]×$\frac{4}{8}$×VREF+$\frac{4}{8}$×VREF. Therefore, the control bit B2R is considered as a signal for increasing VSUBU by $\frac{4}{8}$×VREF.

Here, the first voltage VSUBL is controlled by an input digital code B[1: 0] and a control bit B2S, and may be expressed as follows.

| B2S | B[1:0] | VSUBL |
| --- | --- | --- |
| "0" | "00" | 0/8 × VREF |
| "0" | "01" | 1/8 × VREF |
| "0" | "10" | 2/8 × VREF |
| "0" | "11" | 3/8 × VREF |
| "1" | "00" | 4/8 × VREF |
| "1" | "01" | 5/8 × VREF |
| "1" | "10" | 6/8 × VREF |
| "1" | "11" | 7/8 × VREF |

As described above, the control bit B2S is considered as a signal for increasing VSUBL by $\frac{4}{8}\times$ VREF. When an A/D conversion of an input signal voltage VIN is performed by the SAR-ADC depicted in FIG. 12, a sampling of the input signal voltage VIN is firstly performed.

Specifically, in order to perform an A/D conversion, switches SM0A, SM0, SM1, SM2 of the capacitor main DAC 1 are connected to VIN, and a switch SW is connected. Here, the 6-bit code (input digital code) B[5: 0] and the control bits B2R, B2S are set to B=000000 and B2R=0, B2S=1.

Therefore, a bottom plate of a capacitor circuit 11 of the capacitor main DAC 1 is applied with the input signal voltage VIN, and a top plate VTOP is applied with a threshold voltage VT of the comparator CMP, and a bottom plate of the capacitor (capacitive element) COB is applied with VSUBL=$\frac{4}{8}$×VREF. After that, when opening SW, the sampling of VIN is completed, and the sampled charge Q is expressed as follows:

$$Q=(VT-VIN)\times 8C+(VT-\tfrac{1}{2}VREF)\times C$$

Next, in order to determine the most significant bit, the input digital code B and the control bits B2R, B2S are set as B=100000 and B2R=0, B1S=1.

| B | B2R | B2S |
| --- | --- | --- |
| "100000" | "0" | "1" |

Specifically, in an initial state of the SAR-DAC, when the control bit B2R is set as B2R=0, $\frac{4}{8}\times$ VREF is not added to the second voltage VSUBU, and when the control bit B2S is set as B2S=1, $\frac{4}{8}\times$VREF is added to the first voltage VSUBL. Therefore, when SM2 is connected to VREF, VTOP is expressed as follows:

$$VTOP=VT-(VIN-\tfrac{1}{2}\times VREF)\times \tfrac{8}{9}$$

The above state indicates that the voltage VTOP is higher than a threshold voltage VT when Vin>$\frac{1}{2}$ VERF is established, and that the voltage VTOP is lower than the threshold voltage VT when Vin<$\frac{1}{2}$ VERF is established. Therefore, it is determined whether or not VIN is higher than a half of VREF, and an inverted value of Q is determined as the most significant bit of B.

Further, the second bit from the top of B is determined. Here, the most significant bit of B is set to a value as already determined, and set a second bit from the top of B to "1".

| B | B2R | B2S |
| --- | --- | --- |
| "100000" | "0" | "1" or, |
| "110000" | "0" | "1" |

By the above operations, the voltage of the VTOP is expressed as follows:

when the most significant bit is already determined to "1", $$VTOP=VT-(VIN-\tfrac{3}{4}\times VREF)\times \tfrac{8}{9}$$

when the most significant bit is already determined to "0", $$VTOP=VT-(VIN-\tfrac{1}{4}\times VREF)\times \tfrac{8}{9}$$

The second bit from the top of B is determined by comparing whether the voltage of VTOP is higher or lower than VT. Thereafter, the similar processes may be performed until B[3].

Next, a determination is performed by setting a bit of B[2] to "1". Here, when B[2] is determined to "1", B2R is changed from "0" to "1", and ⅘×VREF is added to VSUBU. This operation corresponds to a rising redundant path depicted by a dotted line in FIG. 13.

Further, when B[2] is determined to "0", B2R is maintained to "0", no effect may be applied to the top plate VTOP. Note that, since B[2], which is previously set to "1" so as to performed a determination, is returned to "0", and this operation corresponds to a falling redundant path depicted by a dotted line in FIG. 13.

As the next, a determination is performed again and the value of the control bit B2S is determined. Here, if the result is at "0", B2S is changed from "1" to "0", and if the result is at "1", B2S is maintained at "1". Therefore, when the result is at "0", VSUBL is decreased by ⅘×VREF.

Subsequently, in order to determine the value of B[1] and B[0], a similar determination is performed to obtain a result. In accordance with the above operations, all bits of B[5: 0], B2R, B2S are determined. Further, a final binary code may be obtained by performing the following operation:

$$D = B + 4 \times B2R - 4 \times (!B2S)$$

As described above, a conversion process depicted in FIG. 13 may be understood to realize by the SAR-ADC of the second embodiment depicted in FIG. 12. Note that, the cycle of performing the redundant processing is not limited in the fourth cycle or the fifth cycle, and further, for example, in the case that the resolution is higher, it is possible to perform the redundant processing by a plurality of cycles.

Figure 14:
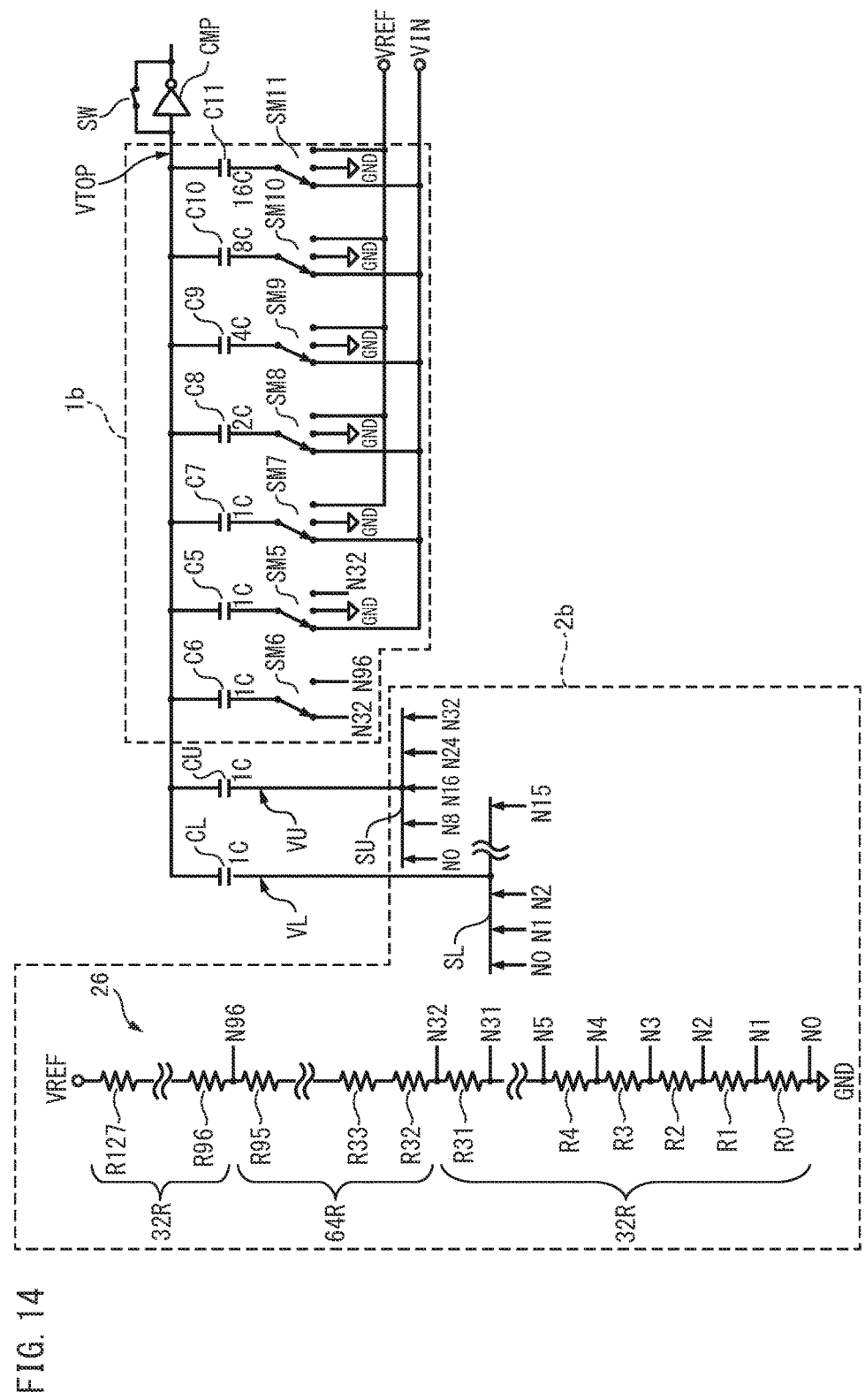
FIG. 14 is a block diagram depicting a third embodiment of the SAR-ADC.

FIG. 14 is a block diagram depicting a third embodiment of the SAR-ADC, wherein the resolution is extended to 12-bit, and a weight of the control bits (redundancy bits) is set by 8-LSB. Here, in FIG. 14, the successive approximation control circuit and the digital error correction circuit depicted in FIG. 6 and FIG. 12 are omitted.

As depicted in FIG. 14, in the SAR-ADC of the third embodiment, a branch (R0 to R31) of ¼ of a power supply rail side of the resistor string 26 (resistive elements R0 to R127) is only used.

This is because, for example, in the following CMOS process using under 1 volt of the recent years where a power supply voltage is about ¼ to 4/3 of a power supply voltage (VREF), a gate voltage of a MOS switch (MOS transistor) is insufficient to turn on the MOS switch.

In FIG. 14, reference signs CL, CU, C6, C5, C7, C8, . . . , C11 denote capacitive elements, 1C, 2C, 4C, 8C, 16C denote relative magnitudes of capacitance values of respective capacitive elements.

Further, reference signs SM6, SM5, SM7, SM8, . . . , SM11 denote switches; R0 to R127 denote resistive elements to constitute a resistor string (resistor circuit) 26; N0, N1, N2, . . . , N96 denote nodes of branches of the resistor string; and 32R, 64R, etc. denote relative magnitudes of the resistance values.

Further, a reference sign SU denotes a switch for selecting a voltage of the nodes N0, N8, N16, N24, N32; SL denotes a switch for selecting a voltage of N0 to N15; VU denotes a node selected by SU and its voltage; and VL denotes a node and its voltage selected by SL.

As apparently depicted from a comparison of FIG. 14 and above described FIG. 6 and FIG. 12, a capacitor main DAC 1b includes a plurality of capacitive elements C6, C5, C7, C8, . . . , C11 and switches SM6, SM5, SM7, SM8, . . . , SM11. Further, the resistor sub DAC 2b includes a plurality of resistive elements R0 to R127 (resistor string 26) and switches SL, SU. Here, the capacitive elements CL, CU, for example, correspond to the capacitive element COB depicted in FIG. 6 and FIG. 12.

In the third embodiment depicted in FIG. 14, each bit of the DAC (internal DAC: capacitor main DAC 1b and resistor sub DAC 2b) is controlled by a 12-bit code (input digital code) B[11: 0] and control bits (redundant bits) B3R, B3S for 8-LSB.

Here, the switches controlled by control signals from the successive approximation control circuit (not depicted), i.e., by the input digital code B[11: 0] and the control bits B3R, B3S are expressed as follows:

| | |
|---|---|
| SM11 | B[11] |
| SM10 | B[10] |
| SM9 | B[9] |
| SM8 | B[8] |
| SM7 | B[7] |
| SM6 | B[6] |
| SM5 | B[5] |
| SU | B[4:3] · B3R |
| SL | B[2:0] · B3S |

For example, the code B[6] for 64-LSB is adapted to control the switch SM6, and select the nodes N32 and N96 of the resistor string 26. Therefore, the bottom plate potential of the capacitor element C6 may be changed to 64/128×VREF, and a weight of 64-LSB may be given.

Further, for example, the code B[5] for 32-LSB is adapted to control the switch SM5, and select the nodes N0 and N32 of the resistor string 26. Therefore, the bottom plate potential of the capacitor element C5 may be changed to 32/128×VREF, and a weight of 32-LSB may be given.

The voltage VU of the bottom plate of the capacitor (capacitor element) CU is set to a voltage selected by the switch SU. Here, the switch SU is controlled by the input digital code B[4: 3] and the control bit B3R, and are expressed as follows:

| B3R | B[4:3] | VU |
|---|---|---|
| "0" | "00" | 0 V |
| "0" | "01" | 8/128 × VREF |
| "0" | "10" | 16/128 × VREF |
| "0" | "11" | 24/128 × VREF |
| "1" | "00" | 8/128 × VREF |
| "1" | "01" | 16/128 × VREF |
| "1" | "10" | 24/128 × VREF |
| "1" | "11" | 32/128 × VREF |

As described above, the switch SU may select 32/128× VREF in addition to B[4] for 16-LSB and B[3] for 8-LSB. Specifically, after B[4 3] is determined, a value obtained by adding 16-LSB is further adapted to be selected.

A voltage VL of the bottom plate of the capacitor element CL is selected by the switch SL. Here, the switch SL is controlled by the input digital code B[2: 0] and the control bit B3S, and are expressed as follows:

| B3S | B[2:0] | VL |
|---|---|---|
| "0" | "000" | 0 V |
| "0" | "001" | 1/128 × VREF |
| "0" | "010" | 2/128 × VREF |
| "0" | "011" | 3/128 × VREF |
| | . . . | |
| "0" | "111" | 7/128 × VREF |
| "1" | "000" | 8/128 × VREF |

-continued

| B3S | B[2:0] | VL |
|---|---|---|
| "1" | "001" | 9/128 × VREF |
| "1" | "010" | 10/128 × VREF |
| "1" | "011" | 11/128 × VREF |
| ... | ... | ... |
| "1" | "111" | 15/128 × VREF |

Further, the switch SL may select 8/128×VREF (B3S is at "1", and B[2: 0] is at "000") in the initial value. Further, as a result of the redundancy determination, when reducing 8-LSB, it may be realized by changing B3S from "1" to "0".

Therefore, in the search of B[2: 0], there are two cases that 0/128×VREF to 7/128×VREF are used, and that 8/128×VREF to 15/128×VREF are used. Therefore, it may be understood that a 12-bit A/D converter (SAR-ADC) including a redundancy of 8-LSB may be realized based on the SAR-ADC of the third embodiment depicted in FIG. 14.

Furthermore, the SAR-ADC of the third embodiment depicted in FIG. 14 only uses ¼ of the power supply rail side and ¼ of a ground (GND) side of branches of the resistor string 26. Specifically, in the first embodiment depicted in FIG. 6, for example, a divided voltage of ½ of the power supply voltage is switched (selected), however, in the third embodiment depicted in FIG. 14, the switching of the divided may become unnecessary. Therefore, for example, the resistor sub DAC 2b may be operated by a low power supply voltage of about 1 V.

Further, according to the SAR-ADC of the third embodiment, for example, even when applying an A/D converter including a 12-bit resolution orb more, the circuit size may not become so large. Concretely, the SAR-ADC including a 12-bit resolution depicted in FIG. 14 may be realized by 35 capacitor elements.

This means that, for example, it is possible to perform a substantial downsizing by compared with those using 2000 or so of the capacitor elements to constitute an SAR-ADC including a 12-bit resolution. In the SAR-ADC of the third embodiment, 128 resistive elements are added to constitute the resistor sub DAC 2b, however, an area occupied by the resistive elements is much smaller than an area occupied by the capacitive elements, and thus this is considered not to be a problem.

Figure 15:
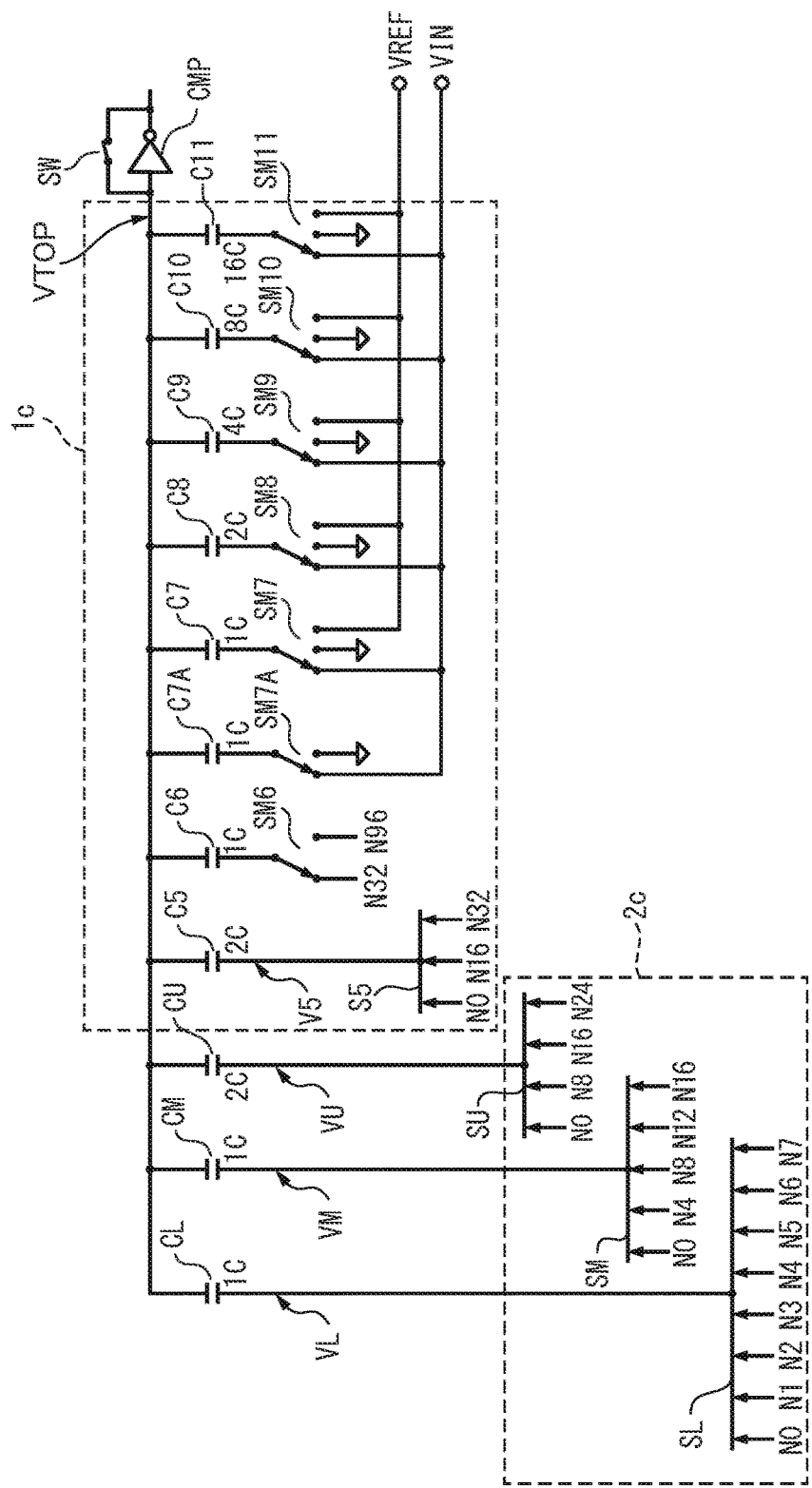
FIG. 15 is a block diagram depicting a modification of the SAR-ADC depicted in FIG. 14.

FIG. 15 is a block diagram depicting a modification of the SAR-ADC depicted in FIG. 14, wherein the resistor sub DAC 2b (resistor string 26) is omitted. Note that the resistor string 26 may be used as the same as that depicted in FIG. 14.

In the SAR-ADC described with reference to FIG. 14, the weight of redundancy is 8-LSB, and the number of conversion cycles is 13 cycles. Therefore, when a decision error of a redundant component exceeds 8-LSB, a correction (compensation) may be difficult. Further, in the SAR-ADC depicted in FIG. 14, it is also difficult to correct a decision error which occurs after the redundancy determination.

Therefore, in the SAR-ADC modification of the third embodiment depicted in FIG. 15, in order to enable a more extensive correction, a redundancy weight is set to 32-LSB. Further, in order to correct the detection error caused after the redundancy determination of the 32-LSB, a redundancy of 4-LSB is added, and the total number of cycles is set to 14 cycles.

In the SAR-ADC modification depicted in FIG. 15, after performing 7 bits determinations, a redundancy determination of 32-LSB is performed. Further, 3 bits determinations are performed. Finally, remaining two bits are determined.

Specifically, in the SAR-ADC modification depicted in FIG. 15, each bit of the DAC are controlled by 12-bit digital code B[11: 0], as well as control bits B5R, B5S of 32-LSB, and the control bits B2R, B2S of 4-LSB.

Here, the switches controlled by the control signals from the successive approximation control circuit (not depicted), i.e., the input digital code B[11: 0] and the control bit (redundant bit) B5R, B5S of 32-LSB and B2R, B2S of 4-LSB are expressed as follows:

| SM11 | B[11] |
|---|---|
| SM10 | B[10] |
| SM9 | B[9] |
| SM8 | B[8] |
| SM7 | B[7] |
| SM6 | B[6] |
| S5 | B[5] · B5R |
| SU | B[4] · B5S |
| SM | B[3:2] · B2R |
| SL | B[1:0] · B2S |

For example, the code B[6] for 64-LSB is adapted to control the switch SM6, and select the nodes N32 and N96 of the resistor string 26. Therefore, the bottom plate potential of the capacitive element C6 may be changed to 64/128× VREF, so that a weight of 64-LSB may be given.

Further, for example, B[5] responsible for 32-LSB, and B5R for adding 32-LSB to B[5] control the switch S5, and generate a voltage V5. The voltage V5 is coupled (applied) to the top plate VTOP through the capacitive element C5. Here, a capacitance value of the capacitive element C5 is 2C, and thus twice ratio may affect to the top plate VTOP with respect to the case that the capacitance value thereof is 1C.

The switch S5 is controlled by the input digital code B[5], and control bits B5R, are expressed as follows.

| B5R | B[5] | VU |
|---|---|---|
| "0" | "0" | 0 V |
| "0" | "1" | 16/128 × VREF |
| "1" | "0" | 16/128 × VREF |
| "1" | "1" | 32/128 × VREF |

As described above, a coupling capacitance value of V5 (capacitance value of the capacitive element C5) is 2C, a weight of 32-LSB by B5R may be given in addition to 32-LSB by the input digital code B[5].

The bottom plate voltage VU of the capacitive element CU becomes a voltage selected by the switch SU based on the input digital code B[4] and the control bit B5S. Here, a capacitance value of the capacitive element CU is 2C, and a change of the voltage VU may affect to the top plate VTOP with respect to the case that the capacitance value thereof is 1C. The relationship of B[4], B5S and VU are expressed as follows:

| B5S | B[4] | VU |
|---|---|---|
| "0" | "0" | 0 V |
| "0" | "1" | 8/128 × VREF |
| "1" | "0" | 16/128 × VREF |
| "1" | "1" | 24/128 × VREF |

Note that, in the case of changing the weight of 32-LSB component during a stage of a redundancy determination, the value of B5S is changed from "1" to "0". In that case, VU is reduced by $16/128 \times$VREF, regardless of the value of the input digital code B[4]. Here, VU may be subtracted by the weight of 32-LSB, since VU is connected to VTOP by 2C.

Further, a voltage VM of the bottom plate of the capacitive element CM becomes a voltage selected by the switch SM based on the input digital code B[3: 2] and the control bit B2R. Here, the relationship of B[3: 2], B2R and VM are expressed as follows:

| B2R | B[3:2] | VU |
|---|---|---|
| "0" | "00" | 0 V |
| "0" | "01" | 4/128 × VREF |
| "0" | "10" | 8/128 × VREF |
| "0" | "11" | 12/128 × VREF |
| "1" | "00" | 4/128 × VREF |
| "1" | "01" | 8/128 × VREF |
| "1" | "10" | 12/128 × VREF |
| "1" | "11" | 16/128 × VREF |

For example, in the case of adding a redundant component of 4-LSB based on the determination result of the input digital code B[2], the control bit B2R is set from "0" to "1". Therefore, the voltage VM is increased by $4/128 \times$VREF regardless the value of the input digital code B[3: 2], so that 4-LSB may be added.

A voltage VL of the bottom plate of the capacitive element CL becomes a voltage selected by the switch SL based on the input digital code B[1: 0] and the control bit B2S. Here, the relationship of B[1: 0], B2S and VL are expressed as follows:

| B2S | B[1:2] | VL |
|---|---|---|
| "0" | "00" | 0 V |
| "0" | "01" | 1/128 × VREF |
| "0" | "10" | 2/128 × VREF |
| "0" | "11" | 3/128 × VREF |
| "1" | "00" | 4/128 × VREF |
| "1" | "01" | 5/128 × VREF |
| "1" | "10" | 6/128 × VREF |
| "1" | "11" | 7/128 × VREF |

Note that, in the case of subtracting the weight of 32-LSB component during a stage of a redundancy determination, the value of B2S is changed from "1" to "0". In this case, the voltage VL is reduced by $4/128 \times$ VREF, regardless of the value of the input digital code B[1: 0].

In the above descriptions, the first embodiment depicted in FIG. 6, the second embodiment depicted in FIG. 12, the third embodiment depicted in FIG. 14, and the modification of the third embodiment depicted in FIG. 15 are explained based on single-ended circuits in order to simplify the explanations, however, those circuits may be constituted by circuits (differential circuits) operated by a complementary signal. Specifically, the present embodiments may be applicable to both single-ended structures and differential structures.

Further, in the above-described embodiments, examples of performing one or few times of redundancy determination are explained, however, it is of course that the number of the redundancy determinations may be arbitrarily set, and further, redundant weights used in the redundancy determinations may also be set arbitrarily.

Figure 16:
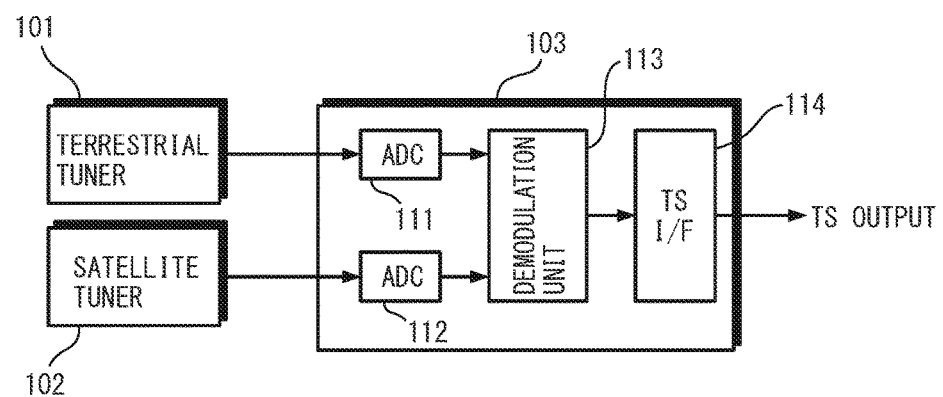
FIG. 16 is a block diagram depicting an example of a semiconductor integrated circuit to which the SAR-ADC of the present embodiment is applied.

FIG. 16 is a block diagram depicting an example of a semiconductor integrated circuit to which the SAR-ADC of the present embodiment is applied, and more specifically depicting a configuration example of a digital television demodulation IC used in a receiving system of a digital television.

As depicted in FIG. 16, the digital television demodulation IC 103 includes two A/D converters (ADC, SAR-ADC) 111, 112, a demodulator 113, and a TS interface (TS I/F) 114; and receives and processes signals from a terrestrial tuner 101 and a satellite wave tuner 102.

The terrestrial tuner 101 and the satellite wave tuner 102 selects a broadcast channel of a radio frequency signal received by an antenna (not depicted), converts to an intermediate frequency (conversion to (IF: Intermediate Frequency), and thereafter outputs the signals to the digital television demodulation IC 103.

The A/D converter (first A/D converter) 111 converts a signal (first analog signal) from the terrestrial tuner 101 to an A/D converted signal (first digital signal), and outputs to the demodulation unit 113. Similarly, the A/D converter (second A/D converter) 112 converts a signal (second analog signal) from the satellite wave tuner (BS tuner (Broadcasting satellite tuner)) 102 to an A/D converted signal (second digital signal), and outputs to the demodulator 113.

Specifically, the A/D converters 111 and 112 are, for example, provided on a front end of the digital television demodulation IC 103, and used for digitizing (digitalizing) the intermediate frequency signals output from the terrestrial tuner 101 and the satellite wave tuner 102.

The demodulation unit 113 demodulates signals digitally converted by the A/D converters 111, 112, and outputs a transport stream (TS) format signal (TS signal), which is a direct format of a video, through the TS interface 114. Note that, for example, the successive approximation A/D converters (SAR-ADCs) according to the present embodiments described above may be applied as the A/D converters 111, 112 of the digital television demodulation IC 103.

Incidentally, the SAR-ADCs according to the present embodiments are not only applied to the A/D converter 111, 112 of the digital television demodulation IC 103 depicted in FIG. 16, but also widely applied to various semiconductor integrated circuits such as a microcontroller (MCU), etc.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An A/D converter comprising:
a capacitor DAC configured to convert high-order M bits, where M and N are integers equal to or greater than 2;
a resistor DAC configured to convert low-order N bits;
a first capacitive element provided between the capacitor DAC and the resistor DAC;
a comparator configured to compare an input signal voltage with a voltage output from the capacitor DAC;
a successive approximation control circuit configured to control the capacitor DAC and the resistor DAC; and
a digital error correction circuit configured to receive an output of the successive approximation control circuit and generate an output digital code corresponding to the input signal voltage, wherein the resistor DAC generates and outputs a voltage by adding or subtracting a wait based on redundant bits in addition to N-bit resolution.

2. The A/D converter according to claim 1, wherein the resistor DAC includes at least two output nodes providing different voltage levels with each other.

3. The A/D converter according to claim 1,
wherein the capacitor DAC comprises:
a capacitor circuit including a plurality of capacitive elements configured to store electric charges by sampling the input signal voltage;
a first switch circuit configured to select and apply one of a ground voltage or a reference voltage to one ends of the plurality of capacitive elements of the capacitor circuit, and
wherein the resistor DAC comprises:
a resistor circuit including a plurality of resistive elements configured to perform a resistance division among the ground voltage and the reference voltage;
a second switch circuit configured to select and output a first voltage generated by a first resistance division of the resistor circuit; and
a third switch circuit configured to select and output a second voltage generated by a second resistance division of the resistor circuit, wherein the first voltage is applied to other ends of the plurality of capacitive elements of the capacitor circuit through the first capacitive element.

4. The A/D converter according to claim 3, wherein a capacitance value of the first capacitive element is an integer multiple of the minimum unit capacitance value in the plurality of capacitive elements of the capacitor circuit.

5. The A/D converter according to claim 3, wherein
the capacitor circuit includes a second capacitive element including a capacitance value as same as a minimum unit capacitance value in the plurality of capacitive elements of the capacitor circuit,
the first switch circuit includes a first switch configured to selectively apply the second voltage or the input signal voltage to the second capacitive element, and
the plurality of capacitive elements of the capacitor circuit include a capacitance value of any power of the minimum unit capacitance value.

6. The A/D converter according to claim 3, wherein
the first switch circuit is controlled by high-order M bits of an, input digital code output from the successive approximation control circuit,
the second switch circuit is controlled by low-order N bits of the input digital code output from the successive approximation control circuit, and
the third switch circuit is controlled by the redundant bits output from the successive approximation control circuit.

7. The A/D converter according to claim 6, wherein the digital error correction circuit generates the output digital code by a determination result based on the high-order M bits of the input digital code, the low-order N bits of the input digital code, and the redundant bits output from the successive approximation control circuit.

8. The A/D converter according to claim 3, wherein the A/D converter further comprises:
a second switch, provided in the comparator, configured to apply a threshold voltage of the comparator to the other ends of the plurality of capacitive elements of the capacitor circuit by closing the second switch.

9. An A/D conversion method of a successive approximation A/D converter, where M and N are integers equal to or greater than 2, the successive approximation A/D converter including a capacitor DAC configured to convert high-order M bits, a resistor DAC configured to convert low-order N bits, a first capacitive element provided between the capacitor DAC and the resistor DAC, a comparator configured to compare an input signal voltage with a voltage output from the capacitor DAC, a successive approximation control circuit configured to control the capacitor DAC and the resistor DAC, and a digital error correction circuit configured to receive an output of the successive approximation control circuit and generate an output digital code corresponding to the input signal voltage, wherein the A/D conversion method comprises:
performing a redundancy determination of the input signal voltage by the comparator based on an output obtained by adding or subtracting a wait based on redundant bits in addition to an input digital code including the low-order N bits, when determining of the low-order N bits by the resistor DAC.

10. The A/D conversion method according to claim 9, wherein the resistor DAC includes at least two output nodes providing different voltage levels with each other.

11. The A/D conversion method according to claim 9, wherein the capacitor DAC comprises:
a capacitor circuit including a plurality of capacitive elements configured to store electric charges by sampling the input signal voltage;
a first switch circuit configured to select and apply one of a ground voltage or a reference voltage to one ends of the plurality of capacitive elements of the capacitor circuit, and wherein the resistor DAC comprises:
a resistor circuit including a plurality of resistive elements configured to perform out a resistance division among the ground voltage and the reference voltage;
a second switch circuit configured to select and output a first voltage generated by a first resistance division of the resistor circuit; and
a third switch circuit configured to select and output a second voltage generated by a second resistance division of the resistor circuit, wherein the first voltage is applied to other ends of the plurality of capacitive elements of the capacitor circuit through the first capacitive element.

12. The A/D conversion method according to claim 11, wherein a capacitance value of the first capacitive element is an integer multiple of the minimum unit capacitance value in the plurality of capacitive elements of the capacitor circuit.

13. A semiconductor integrated circuit including at least one A/D converter, where M and N are integers equal to or greater than 2, wherein the semiconductor integrated circuit comprises:
a capacitor DAC configured to convert high-order M bits;
a resistor DAC configured to convert low-order N bits;
a first capacitive element provided between the capacitor DAC and the resistor DAC;
a comparator configured to compare an input signal voltage with a voltage output from the capacitor DAC;
a successive approximation control circuit configured to control the capacitor DAC and the resistor DAC; and
digital error correction circuit configured to receive an output of the successive approximation control circuit and generate an output digital code corresponding to the input signal voltage, wherein the resistor DAC generates and outputs a voltage by adding or subtracting a wait based on redundant bits in addition to N-bit resolution.

14. The semiconductor integrated circuit according to claim 13, wherein the semiconductor integrated circuit further comprises:
- a first A/D converter configured to convert a first analog signal from a terrestrial tuner into a first digital signal;
- a second A/D converter configured to convert a second analog signal from a satellite wave tuner into a second digital signal;
- a demodulator configured to receive and demodulate the first and second digital signals from the first and second A/D converters; and
- a TS interface configured to receive demodulated signals from the demodulator.

* * * * *